US012642127B2

(12) United States Patent
Bowers et al.

(10) Patent No.: US 12,642,127 B2
(45) Date of Patent: *May 26, 2026

(54) SEMICONDUCTOR DEVICES HAVING AN ELECTROMAGNETICALLY TRANSMISSIVE LID STRUCTURE AND METHODS OF MANUFACTURING SEMICONDUCTOR DEVICES HAVING AN ELECTROMAGNETICALLY TRANSMISSIVE LID STRUCTURE

(71) Applicant: Amkor Technology Singapore Holding Pte. Ltd., Singapore (SG)

(72) Inventors: Shaun Bowers, Gilbert, AZ (US); Bora Baloglu, Oporto (PT)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/378,465

(22) Filed: Oct. 10, 2023

(65) Prior Publication Data

US 2024/0038606 A1 Feb. 1, 2024

Related U.S. Application Data

(63) Continuation of application No. 16/806,927, filed on Mar. 2, 2020, now Pat. No. 11,784,101.

(51) Int. Cl.
H10W 76/15 (2026.01)
H10W 70/05 (2026.01)
(Continued)

(52) U.S. Cl.
CPC ......... H10W 76/15 (2026.01); H10W 70/093 (2026.01); H10W 70/095 (2026.01);
(Continued)

(58) Field of Classification Search
CPC .............. H01L 23/053; H01L 21/4817; H01L 21/4853; H10W 76/15
(Continued)

(56) References Cited

U.S. PATENT DOCUMENTS 5,436,492 A * 7/1995 Yamanaka .............. H01L 21/50
257/702
11,685,649 B2 6/2023 Hong et al.
(Continued)

FOREIGN PATENT DOCUMENTS

TW 201907493 A 2/2019
TW 201941284 A 10/2019

OTHER PUBLICATIONS

Chan, Monolithic Microwave Integrated Circuit Packaging, Handbook of Compound Semiconductors, 1999, pp. 2/22-3/22, Monolithic Microwave Integrated Circuits—An Overview, ScienceDirect, Elsevier, Amsterdam, Netherlands.
(Continued)

*Primary Examiner* — Quoc D Hoang
(74) *Attorney, Agent, or Firm* — Spectrum IP Law Group LLC

(57) ABSTRACT

In one example, a semiconductor device comprises a substrate comprising a conductive structure, an electronic component over a top side of the substrate and electrically coupled with the conductive structure, a lid structure over the substrate and over the electronic component, and a vertical interconnect in the lid structure extending to a top surface of the lid structure and electrically coupled with the conductive structure. Other examples and related methods are also disclosed herein.

15 Claims, 24 Drawing Sheets

(51) Int. Cl.

| | |
|---|---|
| *H10W 70/63* | (2026.01) |
| *H10W 72/00* | (2026.01) |
| *H10W 76/01* | (2026.01) |
| *H10W 76/60* | (2026.01) |
| *H10W 90/00* | (2026.01) |

(52) U.S. Cl.
CPC ....... *H10W 70/635* (2026.01); *H10W 72/071* (2026.01); *H10W 76/01* (2026.01); *H10W 76/60* (2026.01); *H10W 90/701* (2026.01)

(58) Field of Classification Search
USPC .......................................................... 257/693
See application file for complete search history.

(56) References Cited

U.S. PATENT DOCUMENTS

| | | | | |
|---|---|---|---|---|
| 11,784,101 B2 * | 10/2023 | Bowers | ............... | H01L 21/4853 257/693 |
| 2005/0262929 A1 | 12/2005 | Felton et al. | | |
| 2007/0268674 A1 * | 11/2007 | Bauer | ................. | H01L 23/3128 361/730 |
| 2008/0157330 A1 * | 7/2008 | Kroehnert | ........... | H01L 25/0657 257/E23.19 |
| 2010/0038776 A1 | 2/2010 | Bessemoulin | | |

| | | | | |
|---|---|---|---|---|
| 2012/0056329 A1 | 3/2012 | Pagaila et al. | | |
| 2012/0280374 A1 * | 11/2012 | Choi | ........................ | H01L 23/34 257/659 |
| 2015/0137338 A1 * | 5/2015 | Lin | .......................... | H01L 24/82 257/676 |
| 2015/0375994 A1 | 12/2015 | Chien et al. | | |
| 2016/0340561 A1 | 11/2016 | Ikeda et al. | | |
| 2017/0323868 A1 | 11/2017 | Park et al. | | |
| 2018/0277485 A1 | 9/2018 | Han et al. | | |
| 2019/0221547 A1 | 7/2019 | Drab et al. | | |
| 2019/0259676 A1 | 8/2019 | Dresser | | |
| 2019/0311962 A1 | 10/2019 | Dresser | | |
| 2019/0339135 A1 | 11/2019 | Lee | | |

OTHER PUBLICATIONS

Office Action for Taiwan Application No. 110106138 mailed Sep. 5, 2024.

Office Action for Taiwan Application No. 110106138 mailed Jul. 9, 2025.

Office Action for China Application No. 202110225729.9 mailed Oct. 1, 2025.

Office Action for China Application No. 202110225729.9 mailed Feb. 28, 2026.

Office Action for Taiwan Application No. 110106138 mailed Mar. 11, 2026.

* cited by examiner

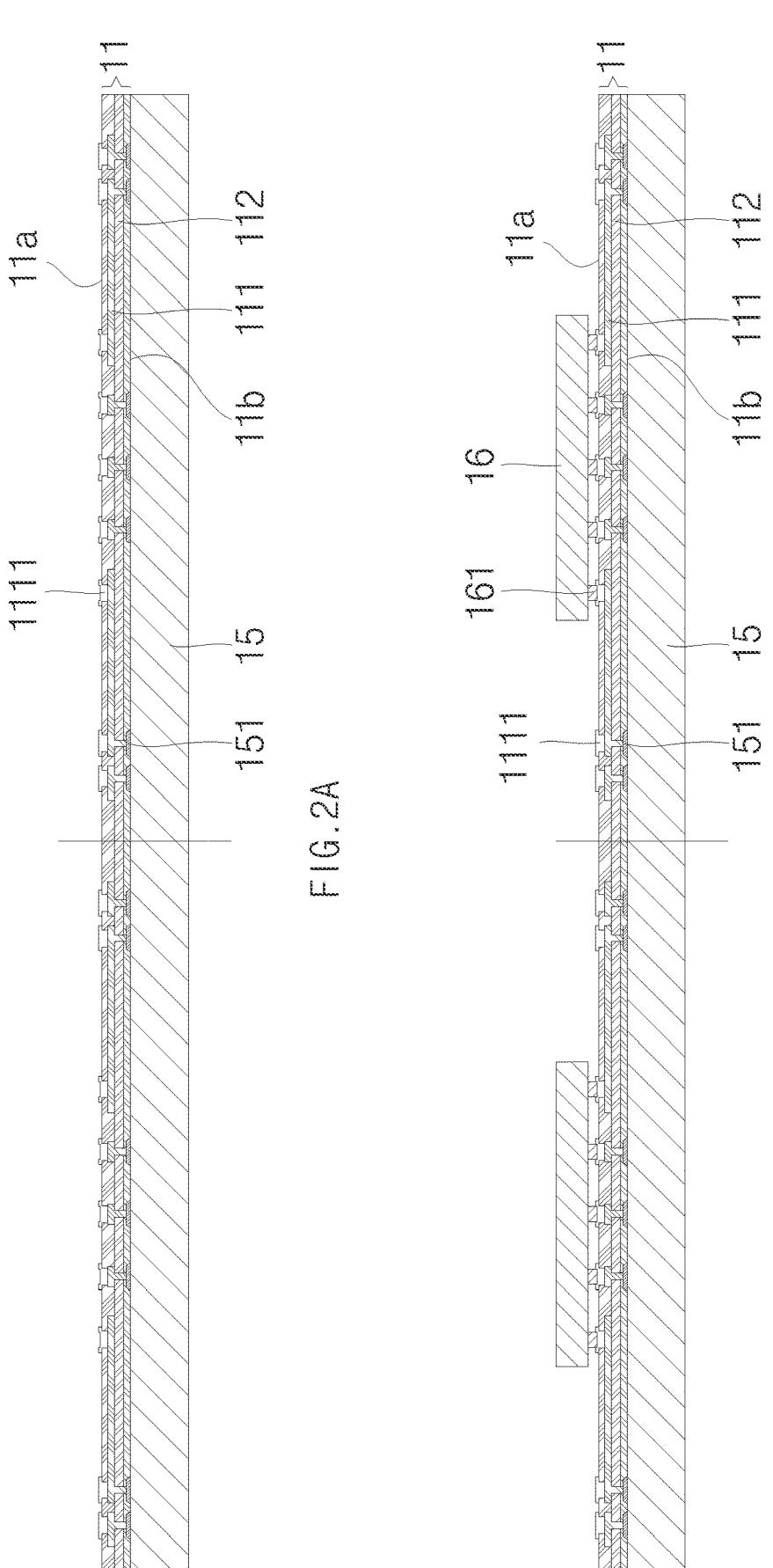
F I G . 2A
F I G . 2B

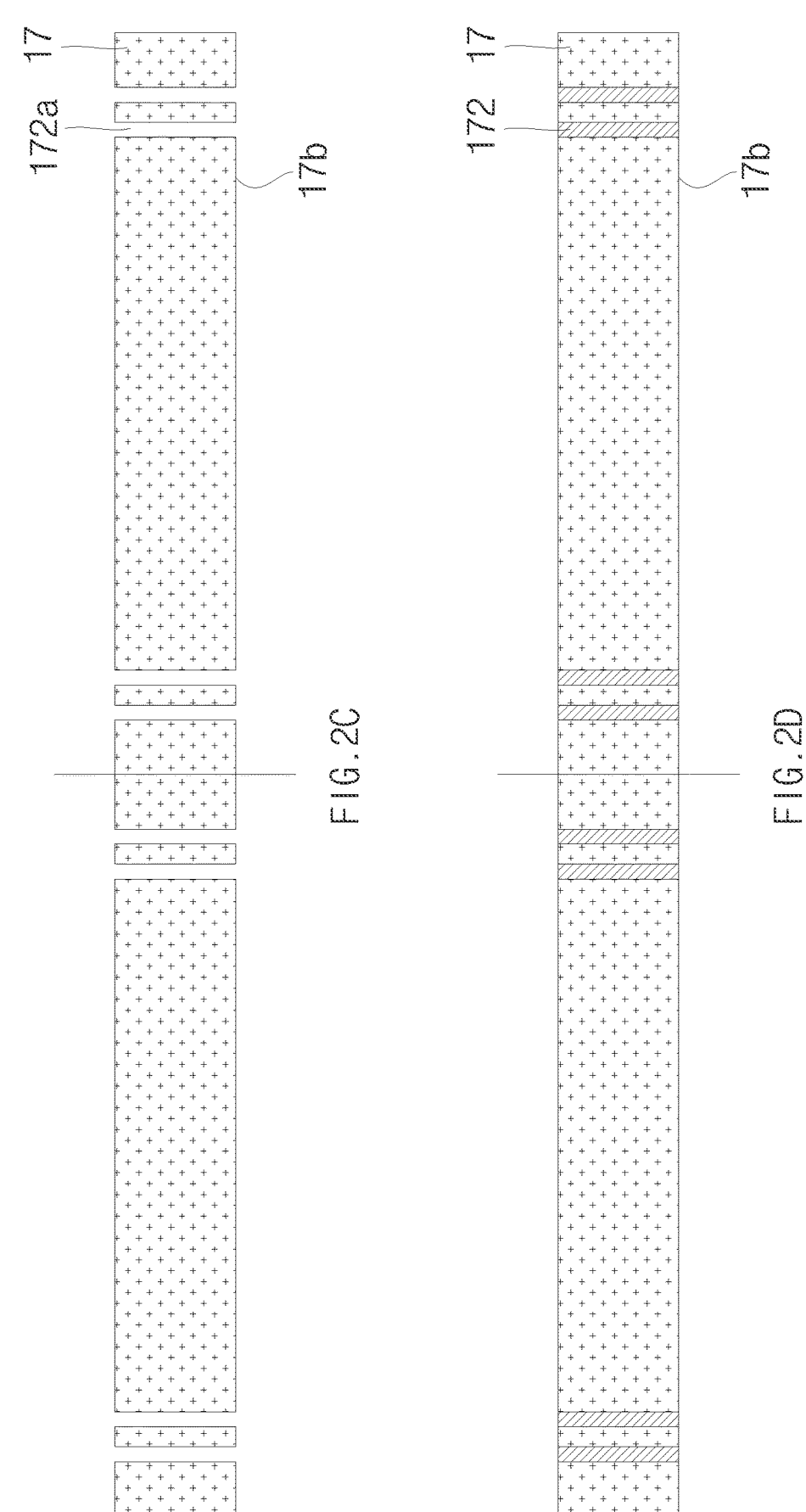

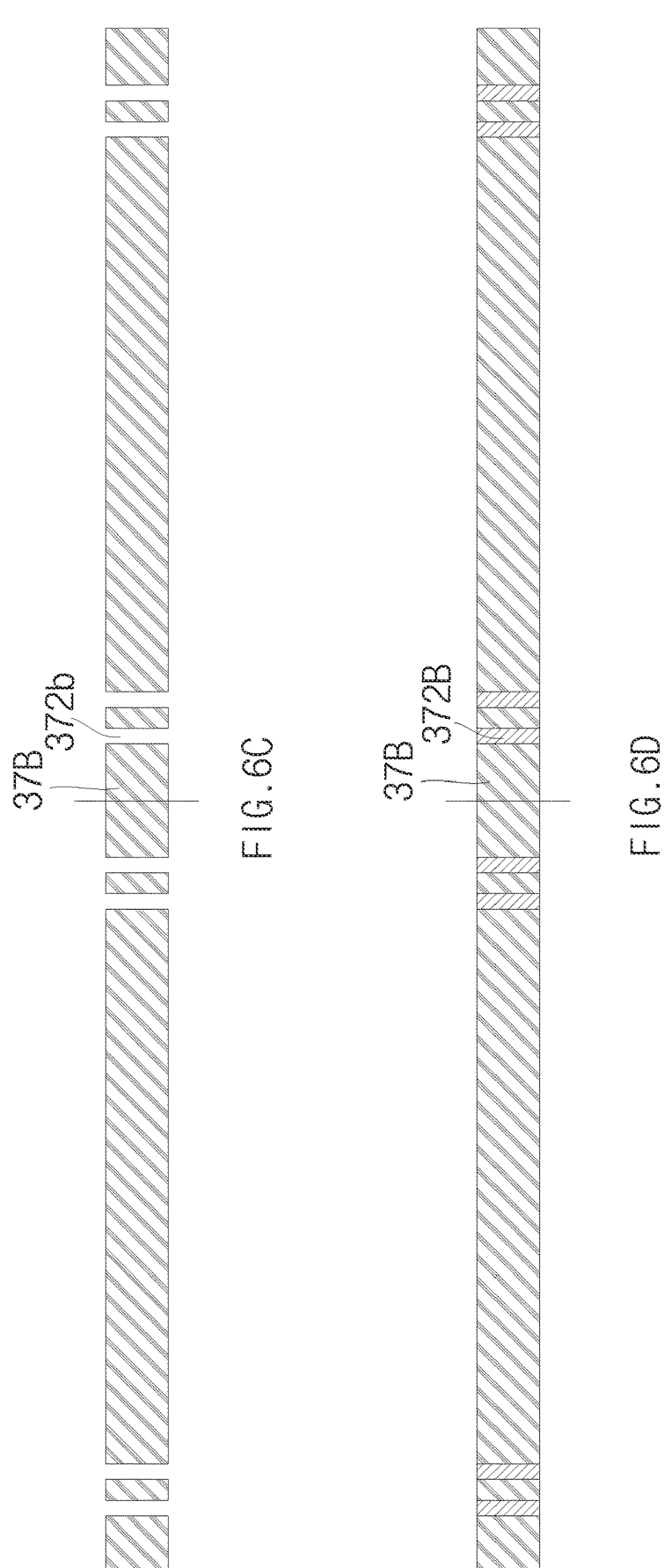

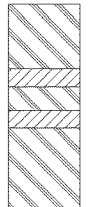
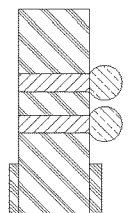
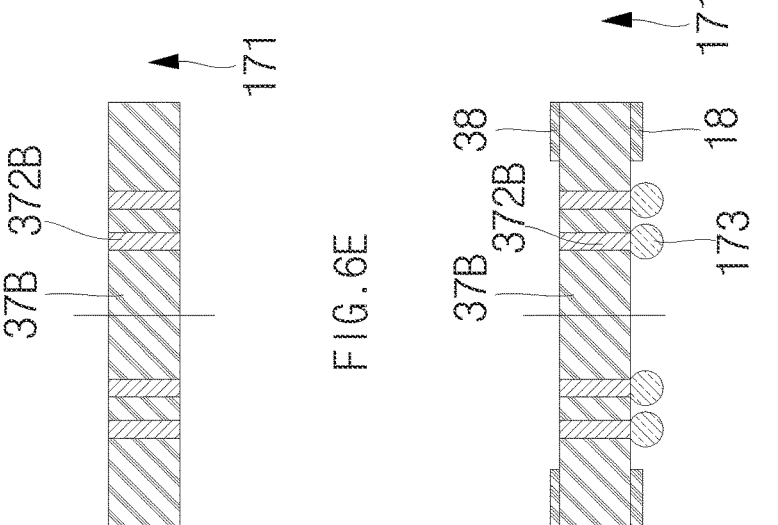
FIG.6E
FIG.6F
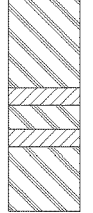
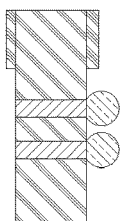

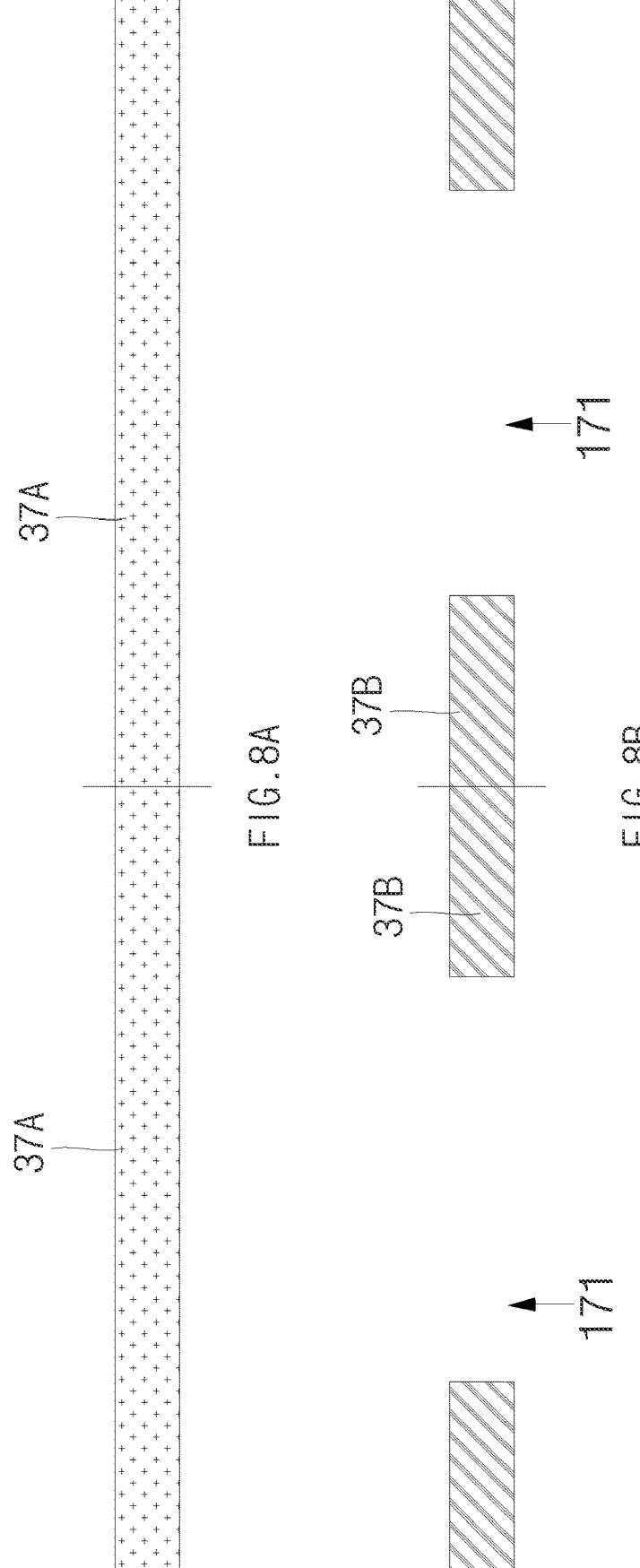

57A

57A

57B

57B

171

SEMICONDUCTOR DEVICES HAVING AN ELECTROMAGNETICALLY TRANSMISSIVE LID STRUCTURE AND METHODS OF MANUFACTURING SEMICONDUCTOR DEVICES HAVING AN ELECTROMAGNETICALLY TRANSMISSIVE LID STRUCTURE

CROSS-REFERENCE TO RELATED APPLICATIONS

The present application is a continuation of U.S. application Ser. No. 16/806,927 filed Mar. 2, 2020 now U.S. Pat. No. 11,784,101. Said application Ser. No. 16/806,927, said U.S. Pat. No. 11,784,101, and Pub. No. US 2021/0272862 A1 are hereby incorporated herein by reference in their entireties.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2H show cross-sectional views of an example method for manufacturing an example semiconductor device.

FIGS. 6A to 6I show cross-sectional views of an example method for manufacturing an example semiconductor device.

FIGS. 8A to 8H show cross-sectional views of an example method for manufacturing an example semiconductor device.

Figure 1:
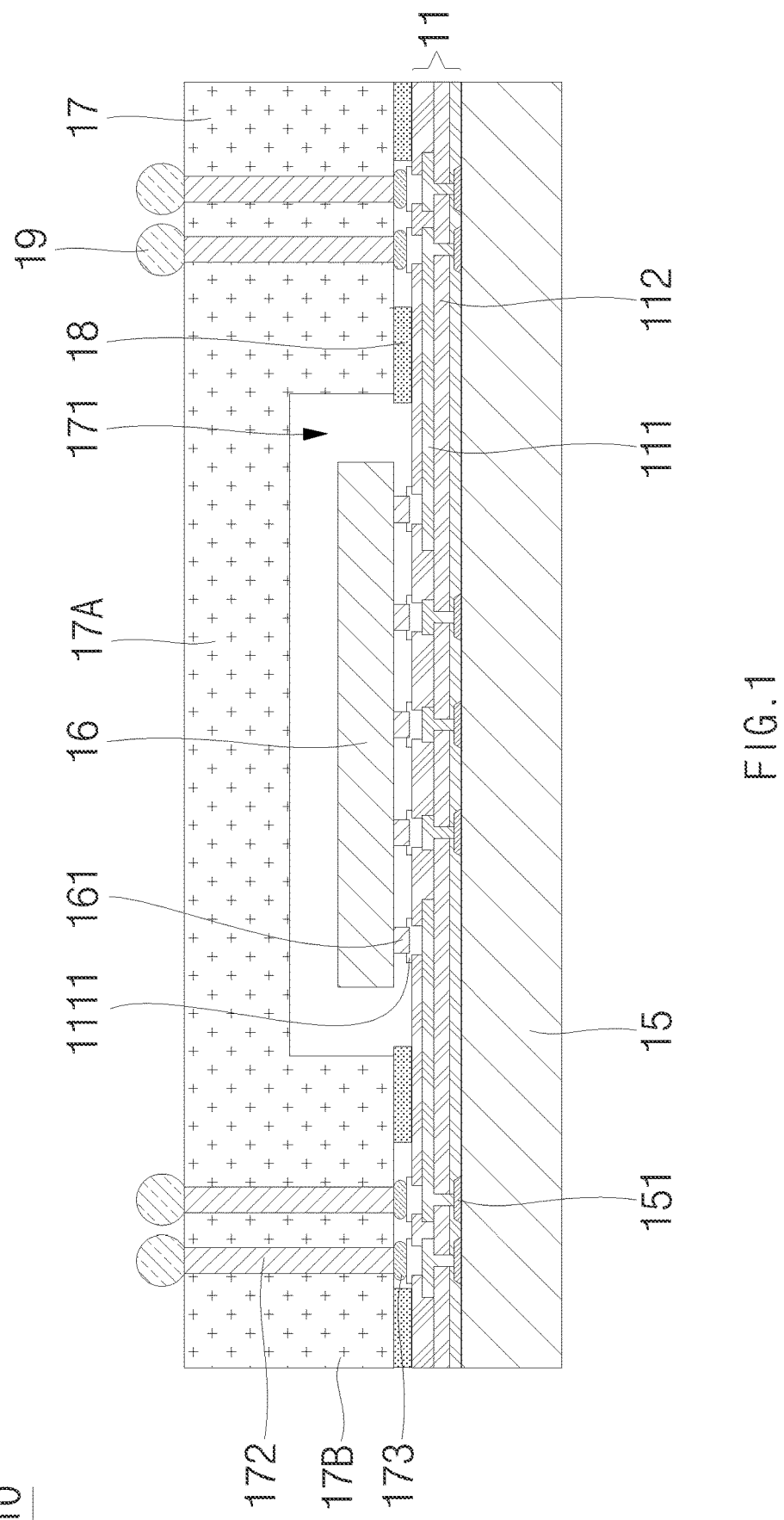
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a substrate comprising a conductive structure, an electronic component over a top side of the substrate and electrically coupled with the conductive structure, a lid structure over the substrate and over the electronic component, and a vertical interconnect in the lid structure extending to a top surface of the lid structure and electrically coupled with the conductive structure.

In another example, a semiconductor device comprises a base component, a substrate over a top side of the base component and comprising a conductive structure, an electronic component over a top side of the substrate and electrically coupled with the conductive structure, a lid structure over the substrate and the electronic component, and a vertical interconnect in the base component electrically coupled with the conductive structure.

In a further example, a method to manufacture a semiconductor device comprises providing a substrate comprising a conductive structure, providing an electronic device over a top side of the substrate and electrically coupling the electronic device with the conductive structure, providing a seal on the top side of the substrate, and providing a lid structure over the top side of the substrate and over the electronic device.

Other examples are included in the present disclosure. Such examples may be found in the figures, in the claims, or in the description of the present disclosure.

FIG. 1 shows a cross-sectional view of an example semiconductor device 10. In the example shown in FIG. 1, semiconductor device 10 can comprise substrate 11, base component 15, electronic component 16, lid structure 17, seal 18, and external connector 19. Seal 18 can be between the top side of substrate 11 and a bottom side of lid structure 17. External connector 19 can connect with vertical interconnect 172 in lid structure 17 to connect with lid connector 173. Vertical interconnect 172 can extend to a stop surface of lid structure 17 and can be electrically coupled with conductive structure 111 of substrate 11, for example via lid connector 173. Lid structure 17 can comprise lid cover 17A and lid sidewall 17B defining lid cavity 171, where lid cover 17A covers a top side of electronic component 16, and lid sidewall 17B bounds lateral sides of electronic component 16. Electronic component 16 can be in lid cavity 171 and can be over a top side of substrate 11. Substrate 11 can comprise conductive structure 111, dielectric structure 112, and substrate terminal 1111. In some examples, first component terminal 151 can electrically connect base component 15 and substrate 11. In some examples, second component terminal 161 can electrically connect electronic component 16 with substrate 11 to electrically connect to conductive structure 111.

Substrate 11, lid structure 17 and external connectors 19 can be referred to as semiconductor package or package and can protect electronic components 16. In some examples, semiconductor package can provide electrical connection between external components and base component 15 or electronic components 16.

Figures 2E, 2F:
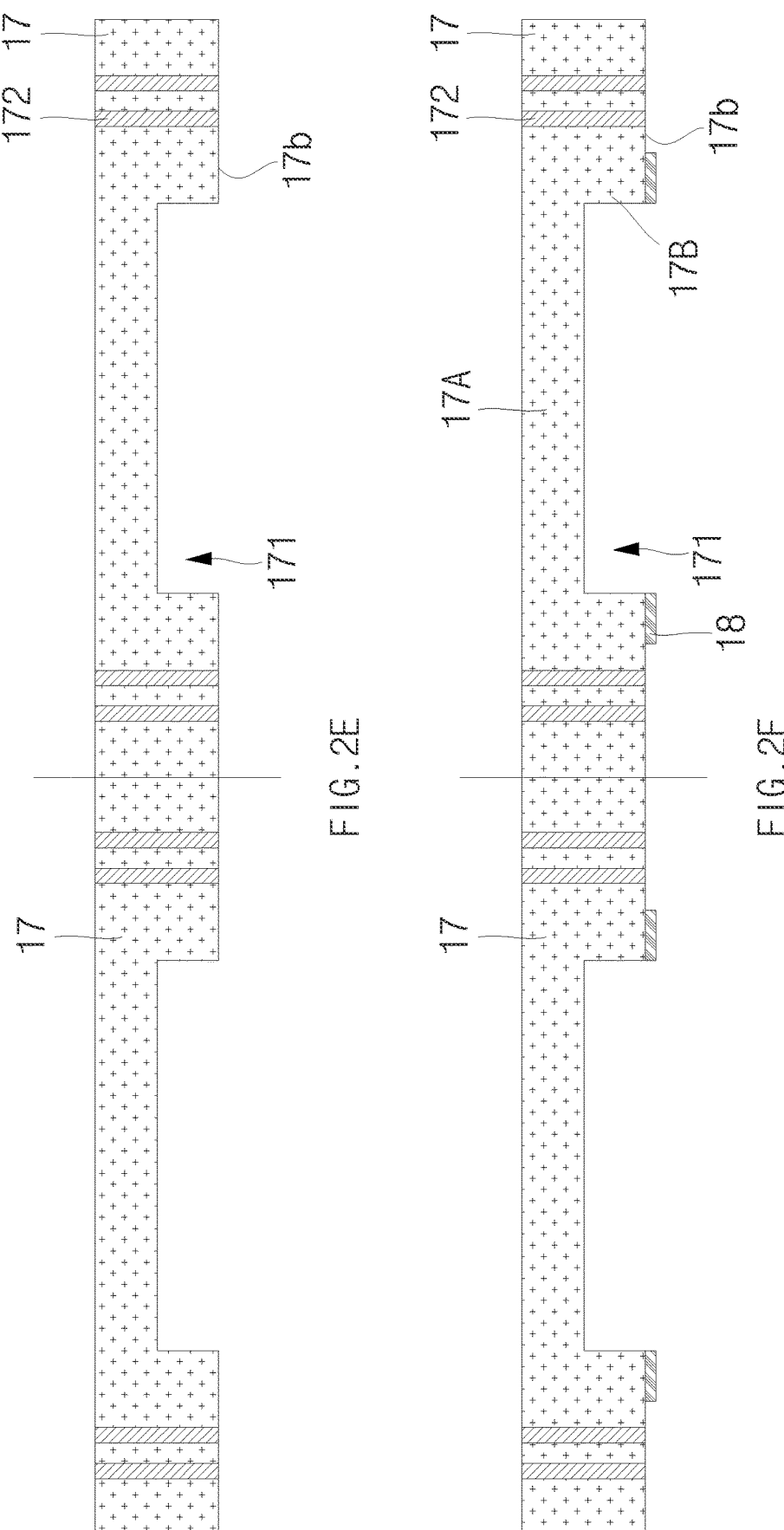

FIGS. 2A to 2H show cross-sectional views of an example method for manufacturing an example semiconductor device 10. FIG. 2A shows a cross-sectional view at an early stage of the method of manufacture. In the example shown in FIG. 2A, substrate 11 can be provided and can comprise top side 11a and bottom side 11b opposite to top side 11a, conductive structure 111, and dielectric structure 112. Base component 15 can be provided and can be at bottom side 11b of substrate 11. While FIG. 2A shows two base components 15 coupled to bottom side 11b of two substrates 11, multiple base components 15 and substrates 11 can be arranged to be spaced apart from one another in a row-wise or column-wise direction.

In some examples, substrate 11 can comprise or be referred to as multi-layered printed circuit board (PCB), a pre-formed substrate, coreless substrate, a Re-Distribution Layer (RDL) substrate, an interposer, or a lead frame. In some examples, substrate 11 can have a thickness in the range from approximately 5 micrometers (μm) to approximately 250 μm.

In some examples, substrate 11 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of one or more inorganic dielectric layers can comprise silicon nitride ($Si_3N_4$), silicon oxide ($SiO_2$), or silicon oxynitride (SiON). The one or more inorganic dielectric layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

In some examples, substrate 11 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

Substrate 11 can comprise conductive structure 111, dielectric structure 112, and substrate terminal 1111. Substrate terminal 1111 can be provided as part of conductive structure 111 exposed on top side 11*a* of substrate 11. Substrate terminal 1111 can establish or be part of an electrical connection path between semiconductor device 10 and an external circuit or another semiconductor device. In some examples, substrate terminal 1111 can comprise or be referred to as a pad, a post, or a bump.

In some examples, conductive structure 111 can comprise one or more conductive layers located between one or more dielectric layers of dielectric structure 112. In some examples, conductive structure 111 can comprise or be referred to as one or more conductors, conductive materials, conductive vias, circuit patterns, traces, or wiring patterns. A portion of conductive structure 111 can be exposed at the top or bottom of dielectric structure 112 to be electrically connected to base component 15, electronic components 16, or external connectors 19. In some examples, conductive structure 111 can comprise copper, iron, nickel, gold, silver, palladium, or tin.

In some examples, dielectric structure 112 can have substantially planar top and bottom sides. The top and bottom sides of dielectric structure 110*a* can be the same with top side 11*a* and bottom side 11*b* of substrate 11, respectively. In some examples, dielectric structure 112 can comprise or be referred to as one or more dielectric layers or a core layer. In some examples, dielectric structure 112 can include a core layer. In some examples, dielectric structure 112 can comprise epoxy resin, phenolic resin, glass epoxy, polyimide, polyester, an epoxy molding compound, or ceramic. In some examples, dielectric structure 112 can have a thickness in the range from approximately 1 μm to approximately 20 μm. In some examples, dielectric structure 112 can provide structural integrity to support substrate 11 or maintain substrate 11 at a substantially planar state.

In some examples, substrate 11 can be formed layer by layer on, or can be integral with, base component 15. In some examples, base components 15 can be attached to conductive structure 111 exposed at bottom side 11*b* of substrate 11. In some examples, base components 15 can be electrically connected to conductive structure 111 of substrate 11 by, for example, mass reflow, thermal compression bonding, or laser assist bonding.

In some examples, base component 15 can comprise or be referred to as a semiconductor die, a semiconductor chip, or a semiconductor package. In some examples, base component 15 can comprise at active electrical circuitry, such as a digital signal processor (DSP), a microprocessor, a network processor, a power management processor, an audio processor, a radio-frequency (RF) circuit, a wireless baseband system-on-chip (SoC) processor, a sensor, an optical or light sensor, a transmitter, a wireless, optical, or light transmitter, or an application specific integrated circuit (ASIC). In some examples, base component 15 can comprise a silicon substrate or a glass substrate. In some examples, base component 15 can be part of substrate 11 or can comprise a structural base, substrate, or support of substrate 11. In some examples, base component 15 can be devoid of active circuitry. In some examples, base component 15 can be optionally omitted. In some examples, base component 15 can have a thickness in the range from approximately 30 μm to approximately 700 μm.

In some examples, first component terminal 151 can electrically connect base component 15 and substrate 11. In some examples, first component terminal 151 can comprise aluminum, copper, gold, or silver. In some examples first component terminal 151 can comprise or be referred to as a pad or bump. First component terminal 151 can be part of base component 15 or can be provided on base component 15 by, for example, sputtering, plating, or evaporation. In some examples, first component terminal 151 can have a thickness in the range from approximately 20 μm to approximately 150 μm.

FIG. 2B shows a cross-sectional view at another stage of the method of manufacture. In the example shown in FIG. 2B, electronic component 16 can be provided over or coupled to top side 11*a* of substrate 11. In some examples, pick-and-place equipment (not shown) can pick up electronic components 16 to place electronic components 16 on conductive structure 111 exposed at top side 11*a* of substrate 11. In some examples, electronic components 16 can be electrically connected to conductive structure 111 of substrate 11 by mass reflow, thermal compression, or laser assist bonding. In some examples, electronic component 16 can be coupled to substrate 11 over base component 15 as part of a Chip-on-Chip (CoC) or a Chip-on-Wafer (COW) process. In one example, substrate 11 can be an RDL substrate that is formed directly on base component 15 or that is part of base component 15. In another example, base component 15 can comprise a base semiconductor device, die, or chip, whether already singulated or still within a semiconductor wafer. In a further example, electronic component 16 can comprise another semiconductor device, die or chip that is attached to base component 15 through component terminals 161.

In some examples, electronic component 16 can comprise or be referred to as a semiconductor die, a semiconductor chip or semiconductor package. In some examples, electronic component 16 can comprise a Micro-Electro-Mechanical-System (MEMS) device, a sensor device, a Light Emitting Diode (LED), or a Light-Detection-And-Ranging (LiDAR) device. In some examples, electronic component 16 can comprise electrical circuitry such as a digital signal processor (DSP), a microprocessor, a network processor, a power management processor, an audio processor, a radio-frequency (RF) circuit, a wireless baseband system-on-chip (SoC) processor, a sensor, an application specific integrated circuit (ASIC), a micro-processor, sensor, power converter, analog or digital data converter, switch, LED, controller, or piezo-electric device. In some examples, electronic component 16 can comprise an RF sensor, a wireless sensor, a light sensor or optical sensor, a transmitter, or a receiver. In some examples, electronic component 16 can have a width in the range from approximately 1 millimeter (mm) to approximately 20 mm.

In some examples, second component terminal 161 can electrically connect electronic component 16 with substrate 11. Second component terminal 161 can comprise or be referred to as a bump, a ball, a pillar, a post, a wire, a solder body, a copper body, or a solder cap. In some examples, second electronic terminal 161 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, second electronic terminal 161 can be provided by using a ball drop process, a screen-printing process, an electroplating process, or a wirebonding process. Second component terminal 161 can have a thickness in the range from approximately 20 μm to approximately 50 μm.

FIG. 2C shows a cross-sectional view at another stage of the method of manufacture. In the example shown in FIG. 2C, lid structure 17 can be provided. In some examples, lid structure 17 can be referred to as a cavity lid. In some examples, lid structure 17 can comprise glass, ceramic, or polymer. In some examples, lid structure 17 can be translucent with respect to permitting passage, transmission, or receipt of light, RF, or other wireless radiation or signals. Lid structure 17 can have vertical hole 172a and a bottom side 17b. Vertical hole 172a can be provided by using chemical, mechanical, or laser etching, drilling, or ablation. Vertical hole 172a can have a diameter in the range from approximately 20 μm to approximately 150 μm.

FIG. 2D shows a cross-sectional view at another stage of the method of manufacture. In the example shown in FIG. 2D, lid vertical interconnect 172 can be provided by filling vertical hole 172a with metal. In some examples, lid vertical interconnect 172 can be referred to as a through glass via (TGV), through silicon via (TSV) or via. In some examples, lid vertical interconnect 172 can comprise copper, silver, aluminum, or gold. Lid vertical interconnect 172 can have a diameter in the range from approximately 20 μm to approximately 150 μm.

FIG. 2E shows a cross-sectional view at another stage of the method of manufacture. In the example shown in FIG. 2E, lid structure 17 can have cavity 171 at bottom side 17b. Cavity 171 can be formed by a method of etching, routing, or polishing, or can be formed around a mold. Cavity 171 can have a larger size than size of electronic component 16. Cavity 171 can have a depth that is equal to or larger than a height of electronic component 16. In one example, cavity 171 can have a depth of 100 μm to 500 μm. Cavity 171 can be configured to cover electronic component 16.

FIG. 2F shows a cross-sectional view at another stage of the method of manufacture. In the example shown in FIG. 2F, seal 18 can be provided around cavity 171 on bottom side 17b of lid structure 17. Seal 18 can be attached on some portions of bottom side 17b surrounding cavity 171. Seal 18 can be referred to as an underfill, a gasket, an adhesive, or a bond ring. In some examples, seal 18 can comprise glass frit, polymer adhesive, metal, or solder. In some examples, seal 18 can be dispensed before, during, or after the attachment of the lid structure in a paste, film, liquid, or liquid suspension material.

Figures 2G, 2H:
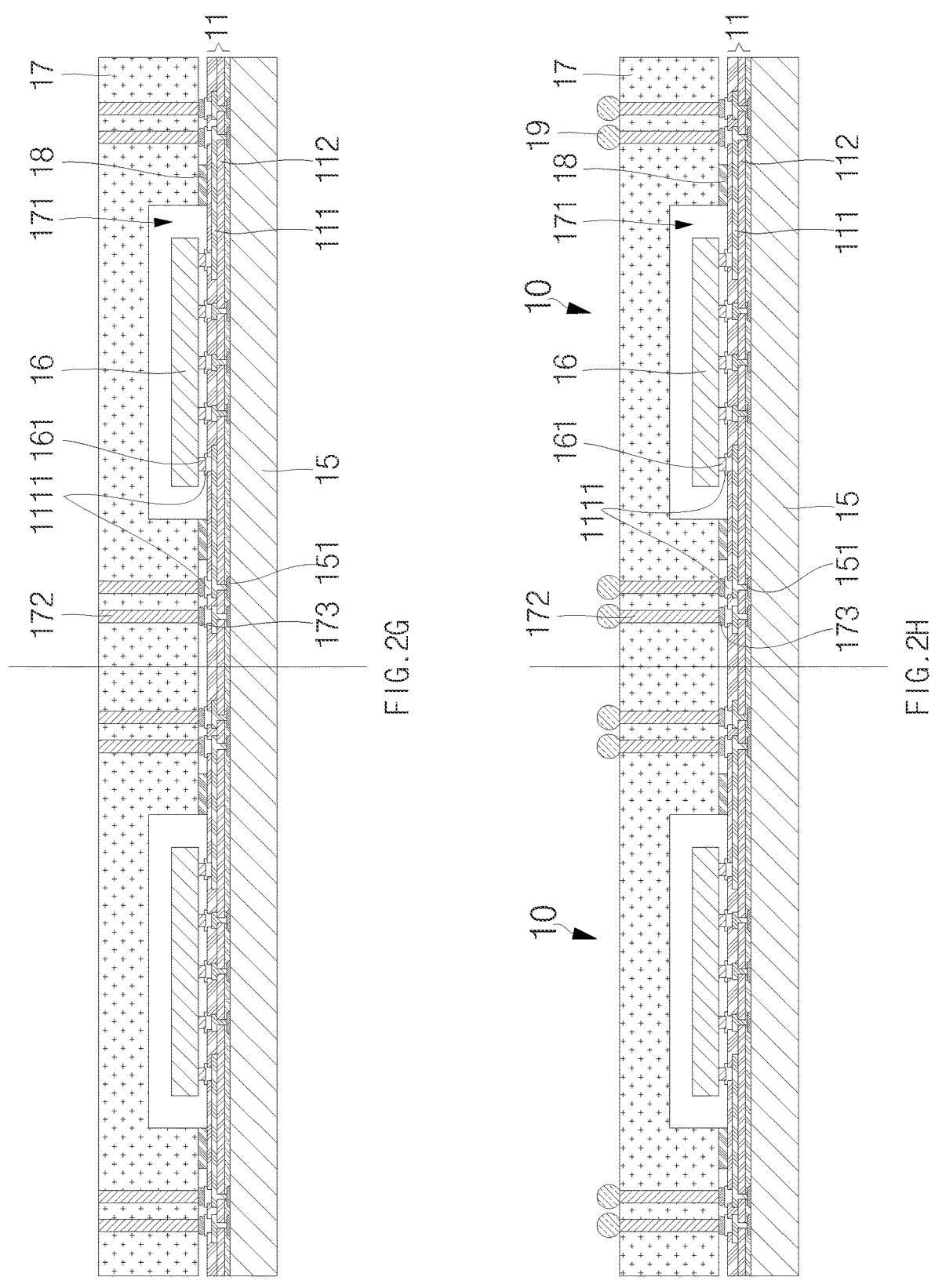

FIG. 2G shows a cross-sectional view at another stage of the method of manufacture. In the example shown in FIG. 2G, lid structure 17 can be provided and can be attached on substrate 11. Lid structure 17 can be attached on substrate 11 with seal 18. Lid vertical interconnect 172 can be electrically coupled to conductive structure 111, for example by connecting substrate terminal 1111 of substrate 11 with lid connector 173. Lid connector 173 can comprise or be referred to as a bump, ball, or pillar such as post or wire, solder body, copper body, or solder cap. In some examples, lid connector 173 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, lid connector 173 can be provided by using a ball drop process, a screen-printing process, or an electroplating process. In some examples, lid connector 173 can have a height of 20 μm to 50 μm.

In some examples, cavity 171 of lid structure 17 can accommodate electrical component 16, and there can be a space between lid structure 17 and the top side or lateral sides or electrical component 16. In some examples, lid structure 17 can be attached on a side of substrate 11 tightly by seal 18. Electronic component 16 within cavity of lid structure 17 can be enclosed in a cavity environment of cavity 171 protected or isolated from an external environment.

FIG. 2H shows a cross-sectional view at another stage of the method of manufacture. In the example shown in FIG. 2H, external connector or interconnect 19 can be on a top side of lid structure 17 and can be electrically coupled with or attached to vertical interconnect 172. In some examples, external connector 19 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, external connector 19 can be provided by ball dropping, screen printing, or electroplating. For example, external connector 19 can be provided by a reflow process after preparing a conductive material containing solder on a side of lid vertical interconnect 172 by ball dropping. In some examples, external connector 19 can be referred to as a bump, a ball, a pillar, a post, a wire, a solder body, a copper body, or a solder cap. In some examples, external connector 19 can have a thickness in the range from approximately 20 μm to approximately 50 μm. In some examples, adjacent semiconductor devices 10 can be singulated, for example by sawing.

Figure 3:
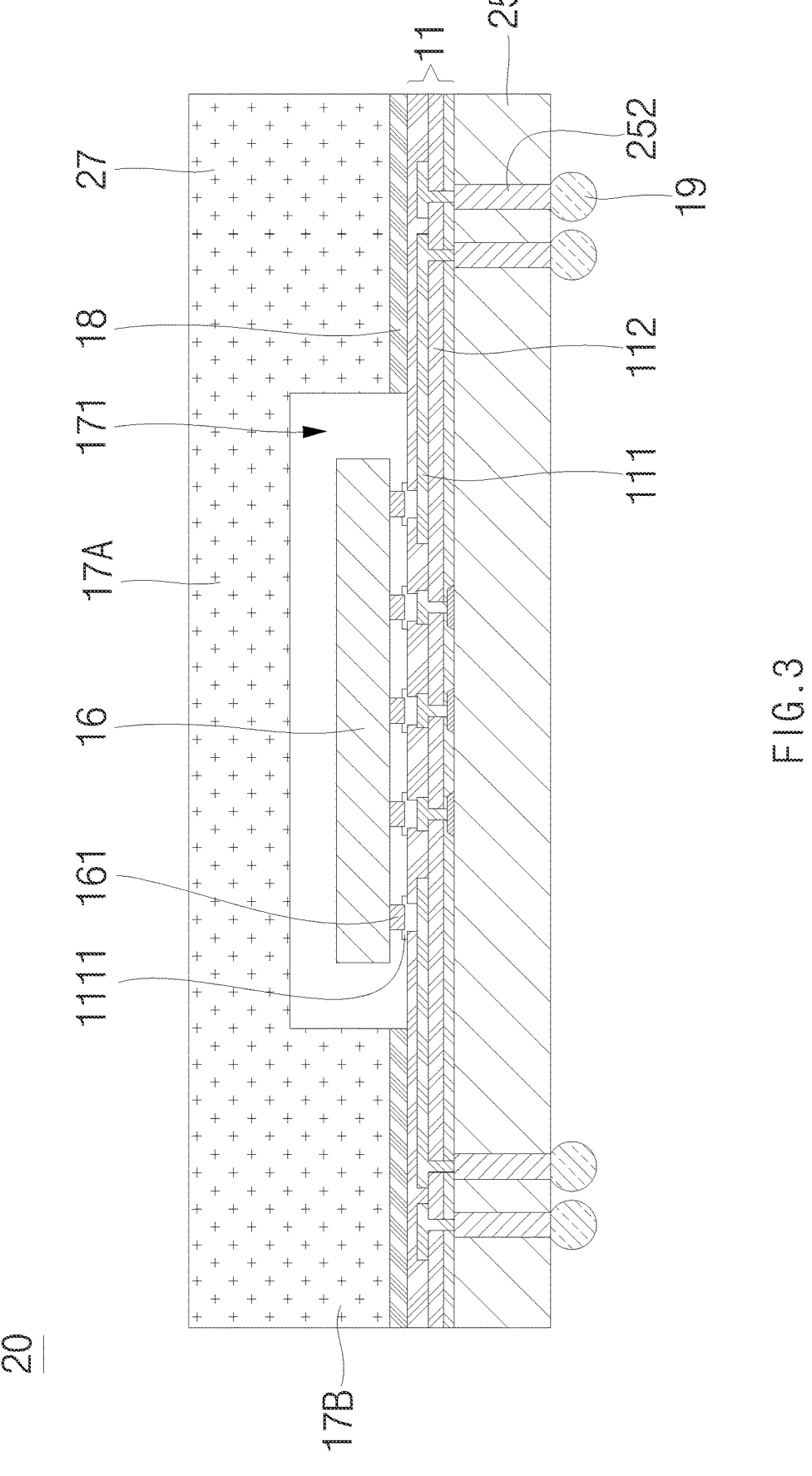
FIG. 3 shows a cross-sectional view of an example semiconductor device.

FIG. 3 shows a cross-sectional view of an example semiconductor device 20. In the example shown in FIG. 3, semiconductor device 20 can comprise substrate 11, base component 25, electronic components 16, lid structure 27, seal 18, and external connector 19. Seal 18 can be between lid structure 27 and substrate 11. Lid structure 27 can comprise cavity 171, lid cover 17A, and lid sidewall 17B defining lid cavity 171. Electronic component 16 can be in cavity 171. Lid sidewall 17B can be between lid cover 17A and substrate 11. Lid structure 27 can be over substrate 11 and electronic component 16. Lid cover 17A covers a top side of electronic component 16, and lid sidewall 17B bounds lateral sides of electronic component 16. In some examples, seal 18 can be between lid sidewall 17B and substrate 11. Substrate 11 can be over a top side of base component 25 and can comprise conductive structure 111, dielectric structure 112, and substrate terminal 1111. Electronic component 16 can be over a top side of substrate 11 and can be electrically coupled with conductive structure 111.

Semiconductor device 20 and its several elements can be similar to other semiconductor devices or corresponding elements described here. For example, semiconductor device 20 and its several elements can be similar to semiconductor device 10 and its corresponding elements. Semiconductor device 20 can comprise base component 25, similar to base component 15 and having vertical interconnects 252. Vertical interconnect 252 can be in base component 25 and can be electrically coupled with conductive structure 111 of substrate 11. External connector or interconnect 19 can be electrically coupled with vertical interconnect 252. Semiconductor device 20 can comprise lid structure 27 which can be similar to lid structure 17 without lid vertical interconnects 172. In some examples, lid structure 27 can comprise the same material as lid structure 17, for example glass.

Substrate 11, lid structure 27, and external connectors 19 can be referred to as semiconductor package or package and can protect electronic components 16. In addition, semiconductor package can provide electrical connection between each of external components and base component 25 or electronic components 16.

Figures 4A, 4B:
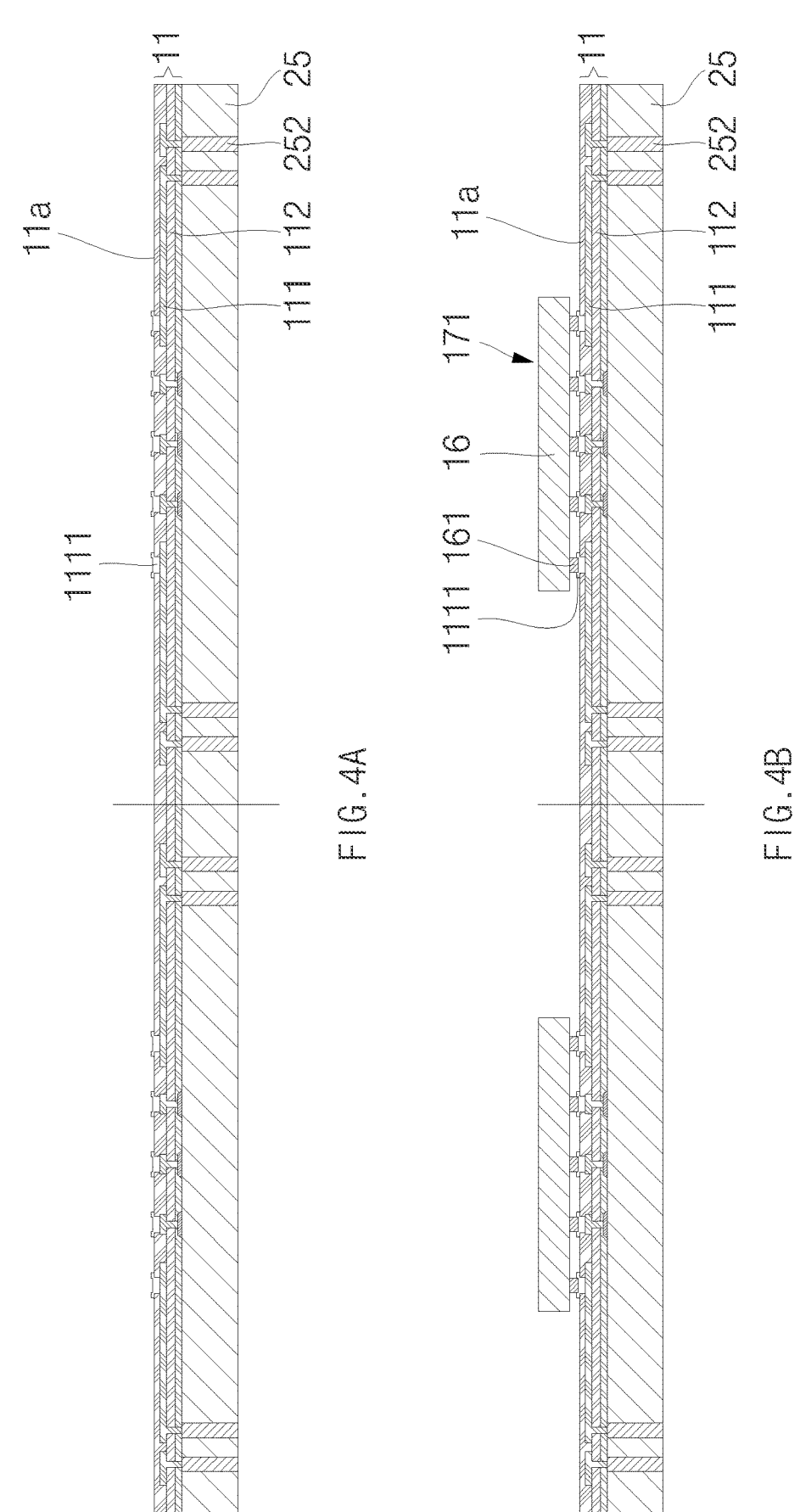
FIGS. 4A to 4F show cross-sectional views of an example method for manufacturing an example semiconductor device.

FIGS. 4A to 4H show cross-sectional views of an example method for manufacturing an example semiconductor device 20. FIG. 4A shows a cross-sectional view at an early stage of the method of manufacture. In the example shown in FIG. 4A, substrate 11 and base component 25 can be provided. Substrate 11 can be formed on, or coupled with, the top side of base component 25. While FIG. 4A shows two base components 25 and two substrates 11, multiple base components 25 and substrates 11 can be arranged to be spaced apart from one another in a row-wise or column-wise direction.

Base component 25 can be similar to base component 15 previously described. In some examples, base component 25 can comprise component vertical interconnect 252. In some examples, component vertical interconnect 252 can be similar to lid vertical interconnect 172 previously described and can extend from the top side to the bottom side of base component 25. In some examples, component vertical interconnect 252 can comprise or be referred to as a through glass via (TGV), a through silicon via (TSV), or a via. In some examples, component vertical interconnect 252 can comprise copper, silver, aluminum, or gold. Component vertical interconnect 252 can be provided by forming a hole within base component 25 using drilling or etching or laser drilling or laser etching and filling the hole with a metal or an electrically conductive material. In some examples, component vertical interconnect 252 can have a diameter in the range from approximately 10 μm to approximately 150 μm.

FIG. 4B shows a cross-sectional view at another stage of the method of manufacture. In the example shown in FIG. 4B, electronic component 16 can be coupled to top side 11a of substrate 11, similar to as described previously with respect to FIG. 2B.

Figures 4C, 4D:
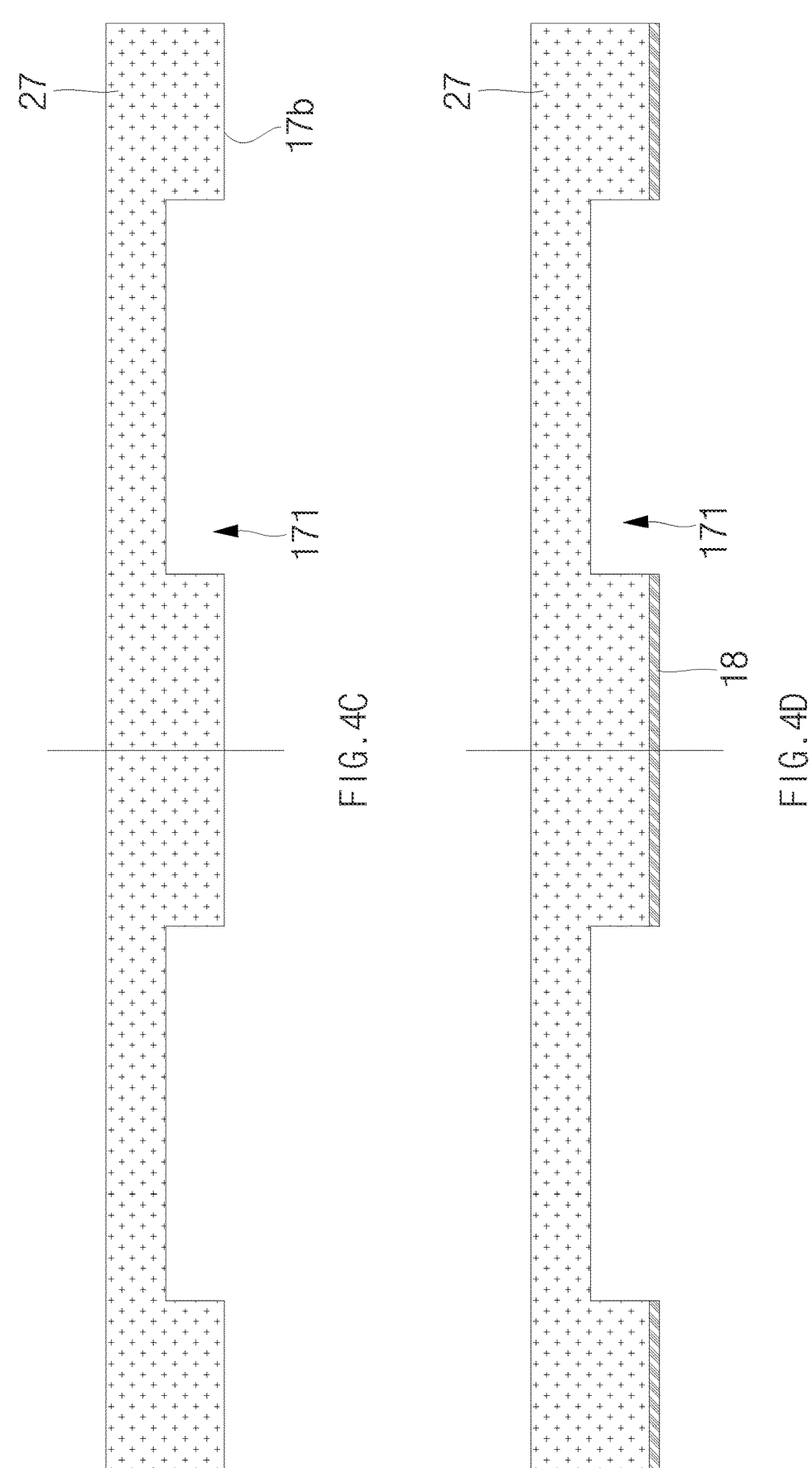

FIG. 4C shows a cross-sectional view at another stage of the method of manufacture. In the example shown in FIG. 4C, lid structure 27 can be provided. Lid structure 27 can be similar to lid structure 17 previously described, and can be devoid of lid vertical interconnects 172. Lid structure 27 can have cavity 171 formed on or in bottom side 17b. Cavity 171 can be formed by a method of etching, routing, or polishing, or can be formed around a mold. Cavity 171 can have a size that larger than the size of electronic component 16. Cavity 171 can have a depth or a width that is larger than a thickness or a width of electronic component 16. In one example, cavity 171 can have a depth of 100 μm to 500 μm. In one example, cavity 171 can be configured to cover electronic component 16.

FIG. 4D shows a cross-sectional view at another stage of the method of manufacture. In the example shown in FIG. 4D, seal 18 can be attached around cavity 171 of lid structure 17. Seal 18 can be attached on bottom side 17b lid structure 27. Seal 18 can be referred to as an underfill, a gasket, an adhesive, or a bond ring. In some examples, seal 18 can comprise glass frit, polymer adhesive, metal, or solder. In some examples, seal 18 can be dispensed before, during, or after the attachment of the lid structure in a paste, film, liquid, or liquid suspension material.

Figures 4E, 4F:
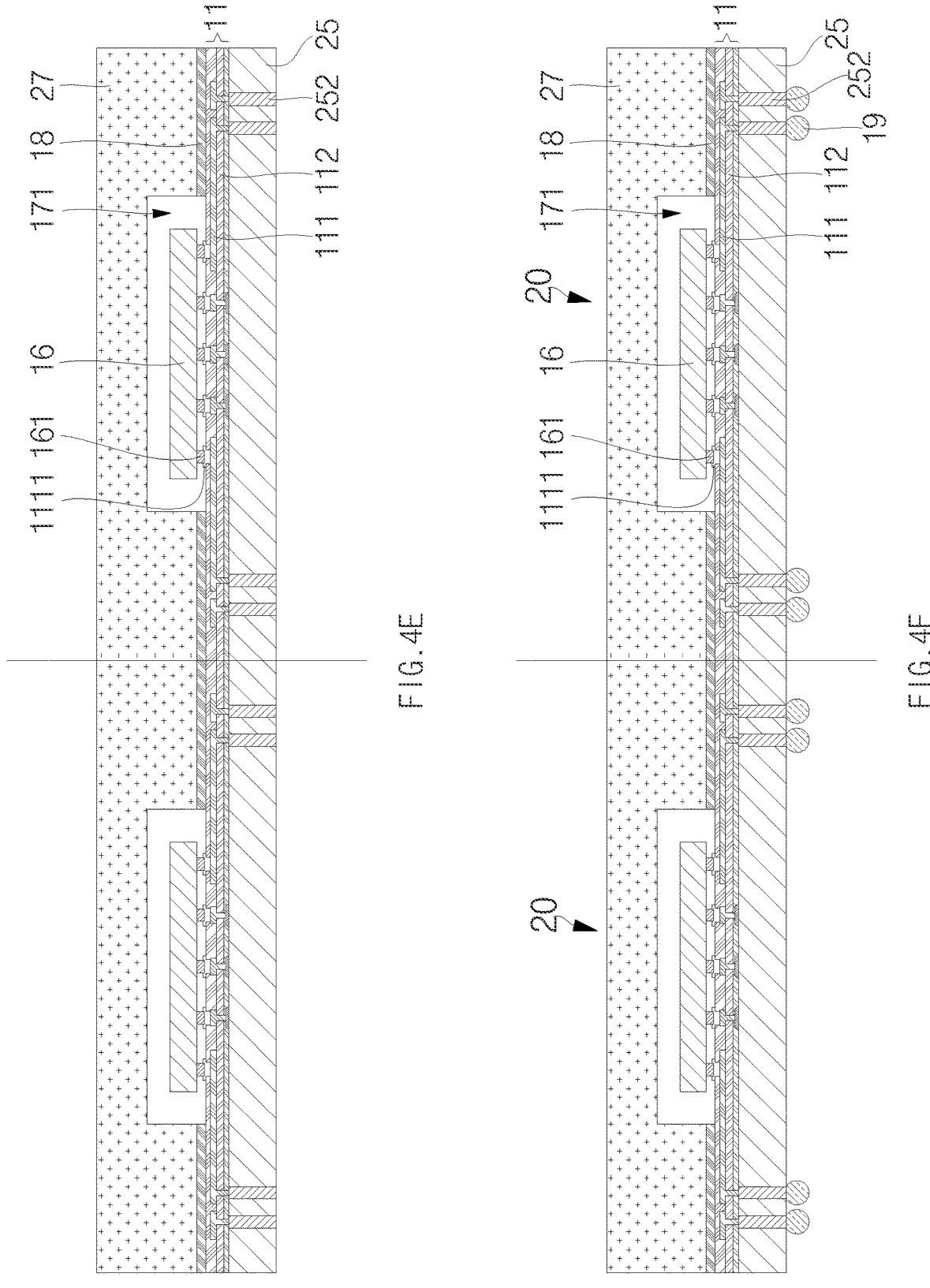

FIG. 4E shows a cross-sectional view at another stage of the method of manufacture. In the example shown in FIG. 4E, lid structure 27 can be attached on substrate 11. Lid structure 27 can be attached on substrate 11 with seal 18. In some examples, cavity 171 of lid structure 27 can accommodate electrical component 16, and there can be a space between lid structure 27 and the top side or lateral sides of electrical component 16.

FIG. 4F shows a cross-sectional view at another stage of the method of manufacture. In the example shown in FIG. 4F, external connector 19 can be coupled to base component 25. In some examples, external connector 19 can be electrically coupled with or attached to component vertical interconnect 252 of base component 25. In some examples, external connector 19 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, external connector 19 can be provided by ball dropping, screen printing, or electroplating. For example, external connector 19 can be provided by a reflow process after preparing a conductive material containing solder on a side of base component 25 by ball dropping. In some examples, external connector 19 can be referred to as a bump, a ball, a pillar, a post, a wire, a solder body, a copper body, or a solder cap. In some examples, external connector 19 can have a thickness in the range from approximately 20 μm to approximately 50 μm. In some examples, adjacent semiconductor devices 20 can be singulated, for example by sawing.

Figure 5:
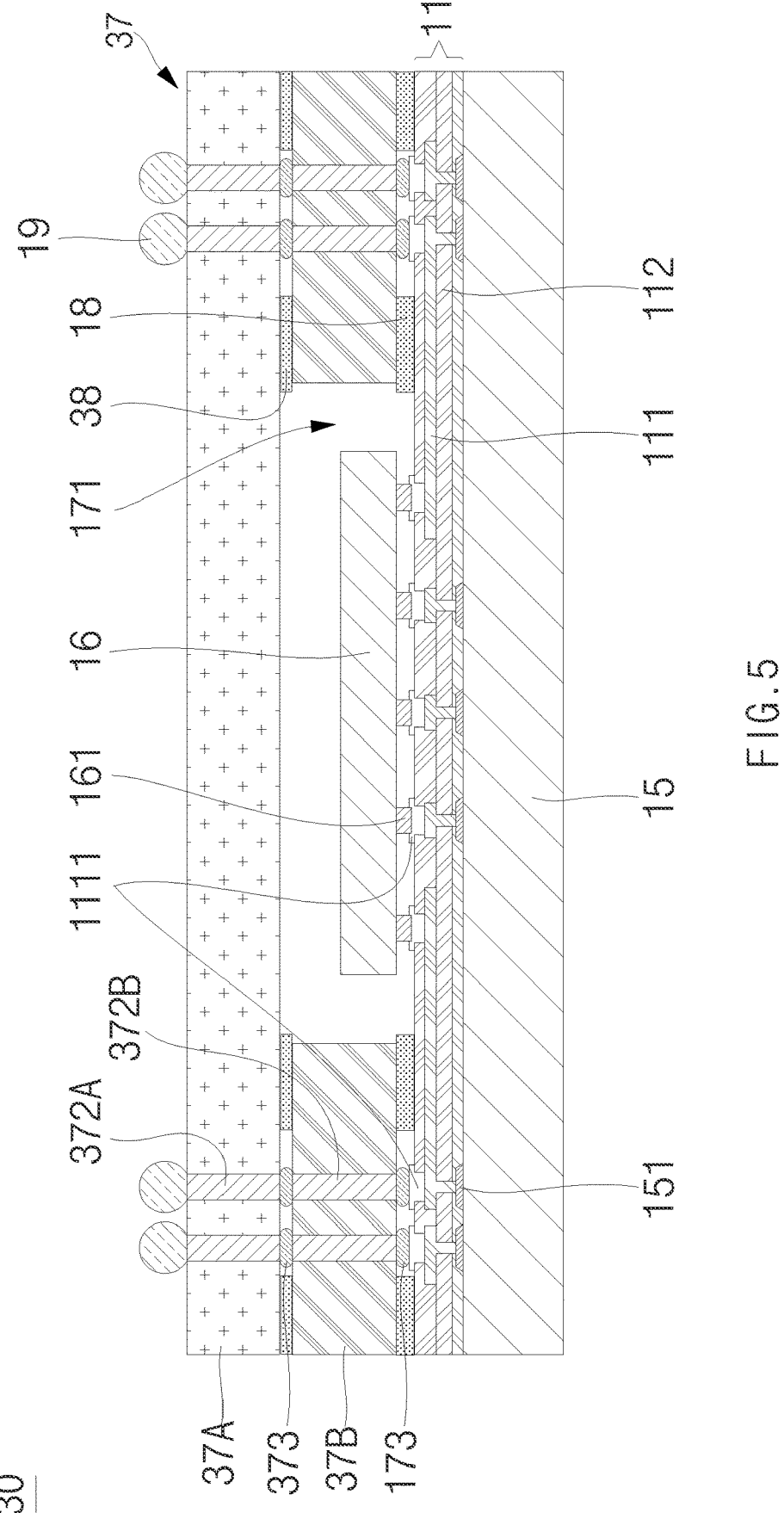
FIG. 5 shows a cross-sectional view of an example semiconductor device.

FIG. 5 shows a cross-sectional view of an example semiconductor device 30. In the example shown in FIG. 5, semiconductor device 30 can comprise substrate 11, base component 15, electronic component 16, lid structure 37, seal 18, and external connector 19. Substrate 11 can comprise conductive structure 111, dielectric structure 112, and substrate terminal 1111.

Semiconductor device 30 and its several elements can be similar to other semiconductor devices or corresponding elements described here. For example, semiconductor device 30 and its several elements can be similar to semiconductor device 10 and its corresponding elements. Lid structure 37 of semiconductor device 30 can be similar to lid structure 17 of semiconductor device 10 and comprises lid cover 37A coupled with lid sidewall 37B to define lid cavity 171. Lid structure 37 can comprise lid vertical interconnect 372A to connect external connector 19 with lid connector 373. Lid sidewall 37B can include a vertical interconnect 372B to connect lid connector 373 with lid connector 173, substrate terminal 1111, first component terminal 151, or conductive structure 111 of substrate 11. Seal 38 can be between sidewall 37B and lid cover 37A, and seal 18 can be between sidewall 37B and the top side of substrate 11. In some examples, the vertical interconnect in lid structure 17 comprises a lid vertical interconnect 372A in lid cover 37A and sidewall vertical interconnect 372B in sidewall 37B. Sidewall vertical interconnect 372A can be electrically connected with lid vertical interconnect 372A and conductive structure 111. External interconnect 19 can on a top side of lid structure 37 can electrically connect with lid vertical interconnect 372A.

Substrate 11, lid structure 37, and external connectors 19 can be referred to as a semiconductor package or package and can protect electronic components 16. In addition, the semiconductor package can provide electrical connection between each of external components and base component 15 or electronic components 16.

Figures 6A, 6B:
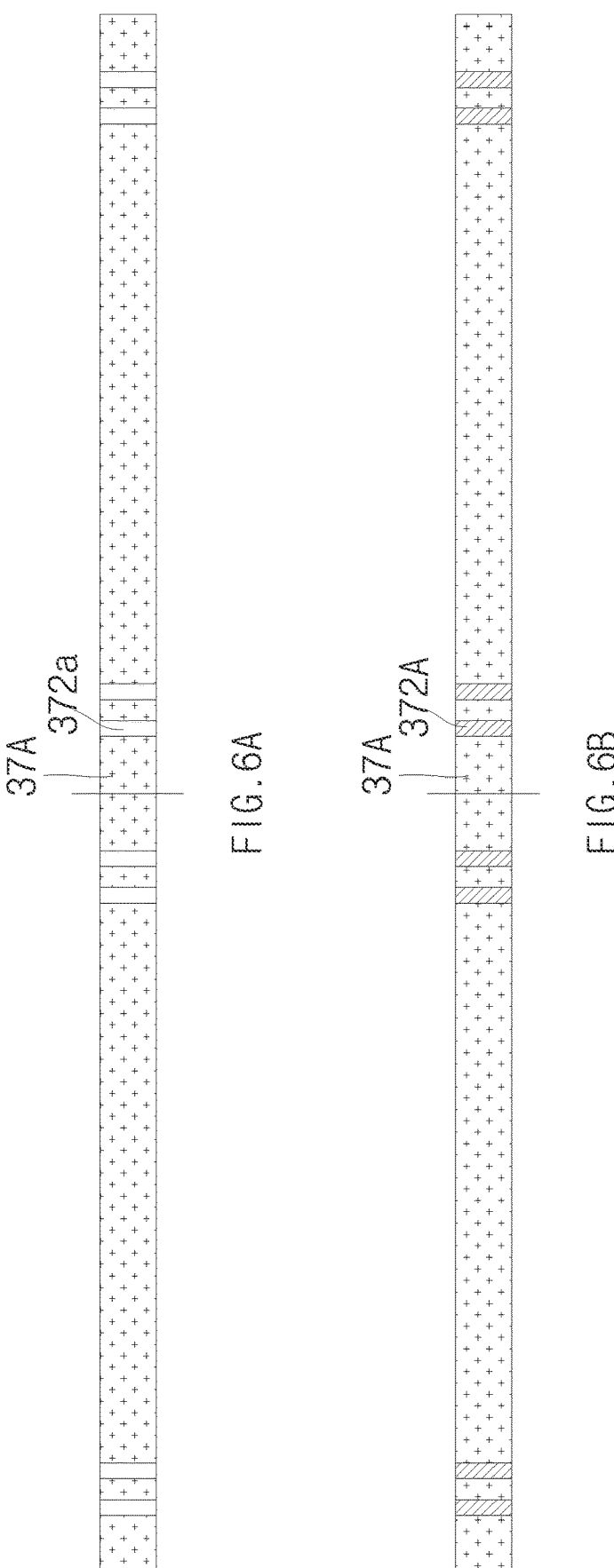

FIGS. 6A to 6H show cross-sectional views of an example method for manufacturing an example semiconductor device 30. FIG. 6A shows a cross-sectional view at an early stage of the method of manufacture. In the example shown in FIG. 6A, lid cover 37A of lid structure 37 can be provided. In some examples, lid cover 37A can comprise glass, ceramic, or polymer. In some examples, lid cover 37A can be translucent with respect to permitting passage, transmission, or receipt of light, radio-frequency (RF), or other wireless radiation or signals. In some examples, lid cover 37A can have vertical hole 372a. In some examples vertical hole 372a can be formed by chemical, mechanical, or laser etching, drilling, or ablation.

FIG. 6B shows a cross-sectional view at another stage of the method of manufacture. In the example shown in FIG. 6B, lid vertical interconnect 372A can be provided within vertical hole 372a. In some examples, lid vertical interconnect 372A can be similar to lid vertical interconnect 172 previously described. In some examples, lid vertical interconnect 372A can comprise or be referred to as a through glass via (TGV) or via. In some examples, lid vertical interconnect 372A can comprise copper, silver, aluminum, or gold. Lid vertical interconnect 372A can be provided by filling vertical hole 372a with metal or electrically conductive material.

FIG. 6C shows a cross-sectional view at another stage of the method of manufacture. In the example shown in FIG. 6C, lid sidewall 37B of lid structure 37 can be provided. In some examples lid sidewall 37B can be referred to as an interposer structure, an intermediate lid structure, or a lid cavity structure. In some examples, lid sidewall 37B can comprise silicon, glass, ceramic, or polymer material. In some examples, lid sidewall 37B can have vertical hole 372b. In some examples, vertical hole 372b can be formed by chemical, mechanical, or laser etching, drilling, or ablation.

FIG. 6D shows a cross-sectional view at another stage of the method of manufacture. In the example shown in FIG. 6D, lid vertical interconnect 372B can be provided within vertical hole 372b. In some examples, lid vertical interconnect 372B can be similar to lid vertical interconnect 172 previously described. In some examples, lid vertical interconnect 372B can be referred to as a through glass via (TGV), through silicon via (TSV), or via. Lid vertical interconnect 372B can comprise copper, silver, aluminum, or gold. Lid vertical interconnect 372B can be provided by filling vertical hole 372b with metal or electrically conductive material.

FIG. 6E shows a cross-sectional view at another stage of the method of manufacture. In the example shown in FIG. 6E, cavity 171 can be formed through lid sidewall 37B. Cavity 171 can extend from top side to bottom side of lid sidewall 37B. In some examples, cavity 171 can be formed by chemical, mechanical, or laser etching, drilling, or ablation.

FIG. 6F shows a cross-sectional view at another stage of the method of manufacture. In the example shown in FIG. 6F, seal 18 or seal 38 can be attached on top side and bottom side of lid sidewall 37B around cavity 171. Seal 18 or seal 38 can be referred to as an underfill, a gasket, an adhesive, or a bond ring. In some examples, seal 18 or seal 38 can comprise glass frit, polymer adhesive, metal, or solder. In some examples, seal 18 or seal 38 can be dispensed or provided before, during, or after the attachment of the lid structure in a paste, film, liquid, or liquid suspension material. Lid connector 173 can be provided contacting lid vertical interconnect 372B.

Figures 6G, 6H:
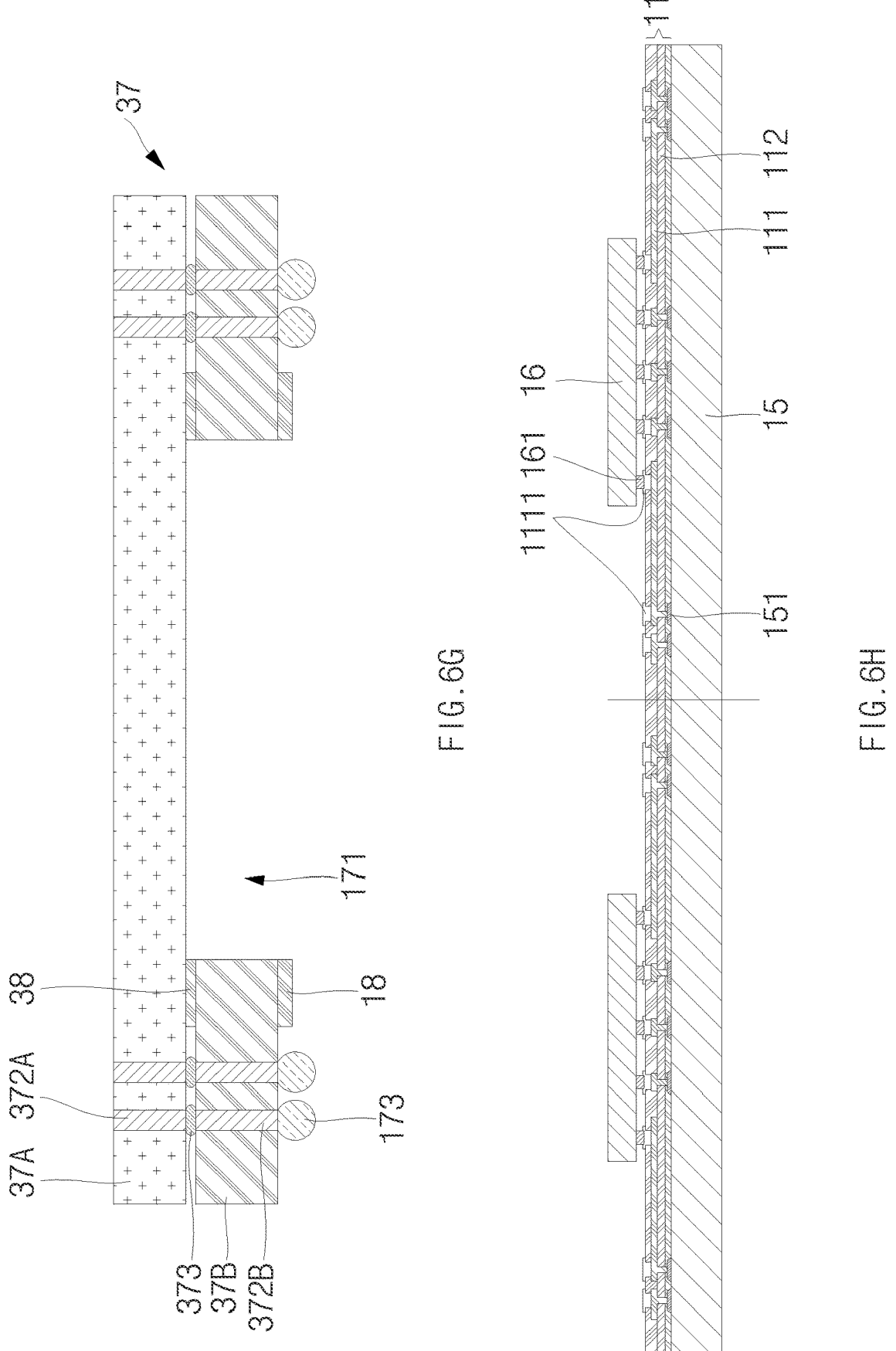

FIG. 6G shows a cross-sectional view at another stage of the method of manufacture. In the example shown in FIG. 6G, lid cover 37A can be coupled with lid sidewall 37B to define lid structure 37. Lid cover 37A and lid sidewall 37B can be coupled together by seal 38 around cavity 171. Lid vertical interconnect 372A of lid cover 37A and lid vertical interconnect 372B of lid sidewall 37B can be coupled to each other by lid connector 373. Lid connector 173 can be provided below lid sidewall 37B. In some examples, lid connector 373 can be similar to lid connector 173.

FIG. 6H shows a cross-sectional view at another stage of the method of manufacture. In the example shown in FIG. 6H, electronic component 16 can be coupled to or over top side 11a of substrate 11, similar to as described previously with respect to FIG. 2B.

Figure 6I:
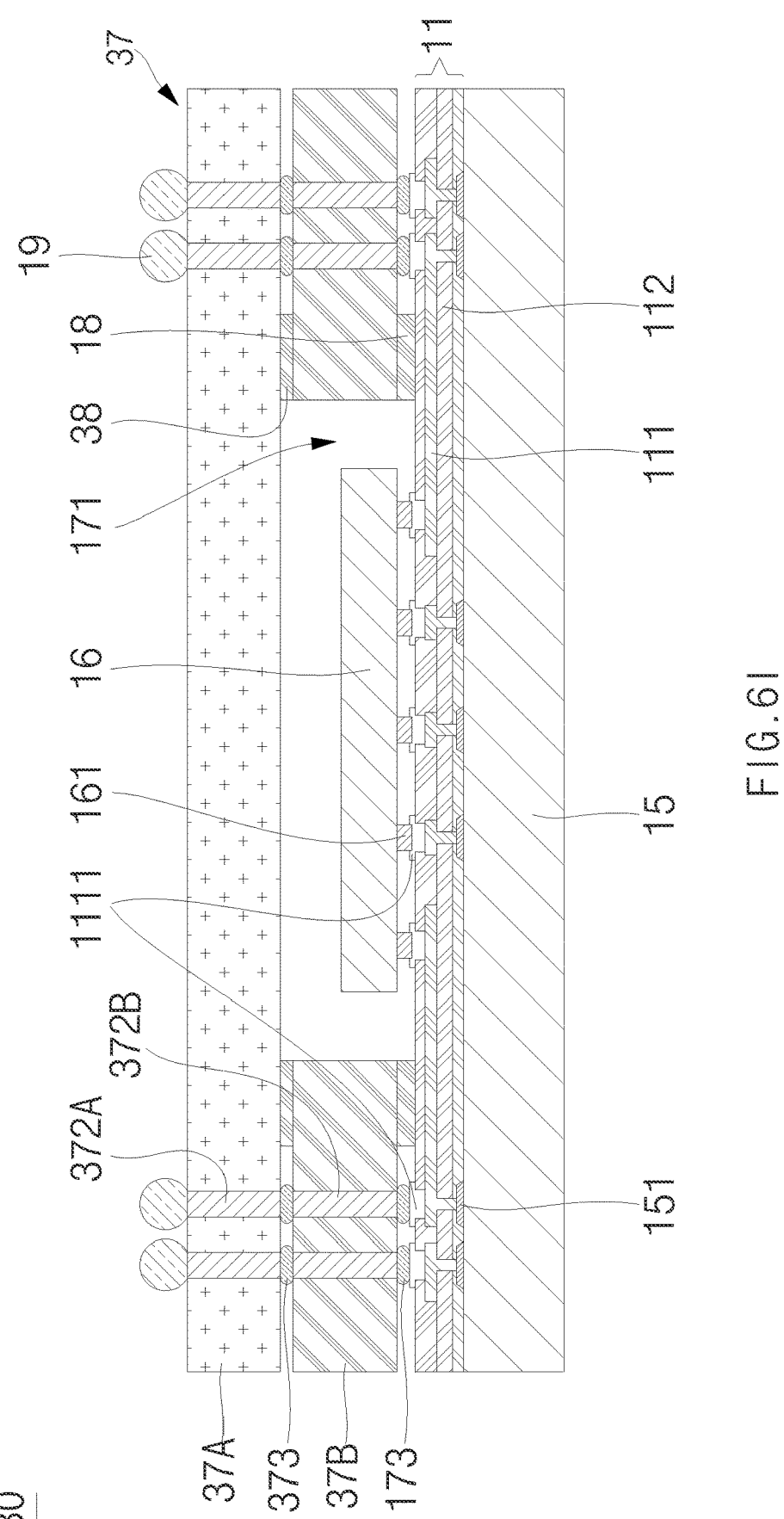

FIG. 6I shows a cross-sectional view at another stage of the method of manufacture. In the example shown in FIG. 6I, lid structure 37 can be attached to substrate 11 through seal 18, lid vertical interconnect 372B can be electrically coupled to substrate terminal 1111 of substrate 11 with lid connector 173, and external connector 19 can be coupled to lid vertical interconnect 372A, similar to as described above with respect to FIGS. 2G-2H for lid structure 17. Cavity 171 of lid structure 37 can surround electronic component 16. In some examples, adjacent semiconductor devices 30 can be singulated, for example by sawing after attachment of lid structure 37.

Figure 7:
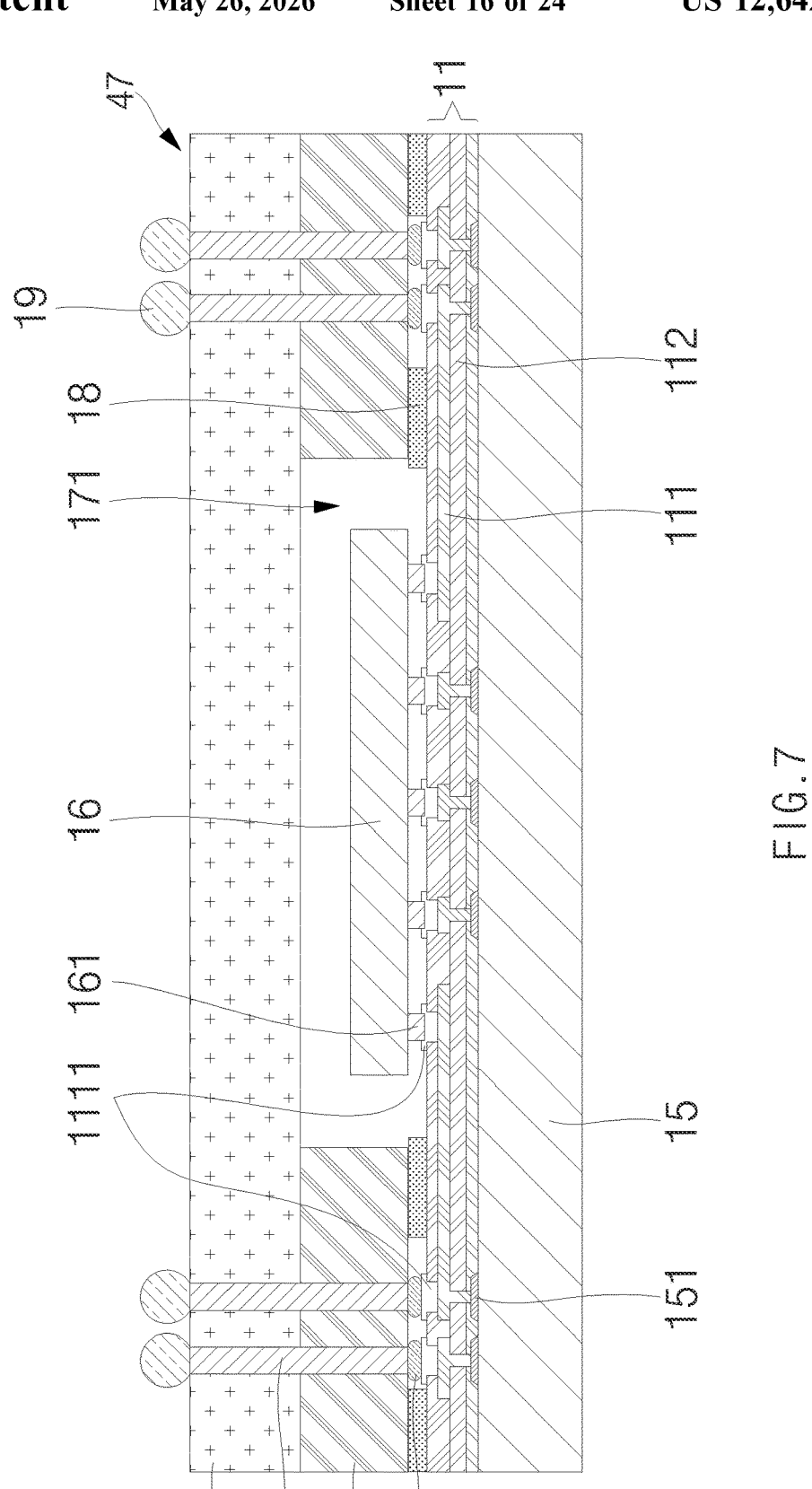
FIG. 7 shows a cross-sectional view of an example semiconductor device.

FIG. 7 shows a cross-sectional view of an example semiconductor device 40. In the example shown in FIG. 7, semiconductor device 40 can comprise substrate 11, base component 15, electronic components 16, lid structure 47, seal 18, and external connector 19. Substrate 11 can comprise conductive structure 111, dielectric structure 112, and substrate terminal 1111.

Semiconductor device 40 and its several elements can be similar to other semiconductor devices or corresponding elements described here. For example, semiconductor device 30 and its several elements can be similar to semiconductor device 40 and its corresponding elements. Lid structure 47 of semiconductor device 40 can be similar to lid structure 37 of semiconductor device 30 comprising lid cover 37A contacting lid sidewall 37B to define lid cavity 71 and comprises vertical interconnects 172 extending through both lid cover 37A and lid sidewall 37B.

Substrate 11, lid structure 47 and external connectors 19 can be referred to as a semiconductor package or package and can protect electronic components 16. In addition, the semiconductor package can provide electrical connection between each of external components and base component 15 or electronic component 16.

Figures 8C, 8D:
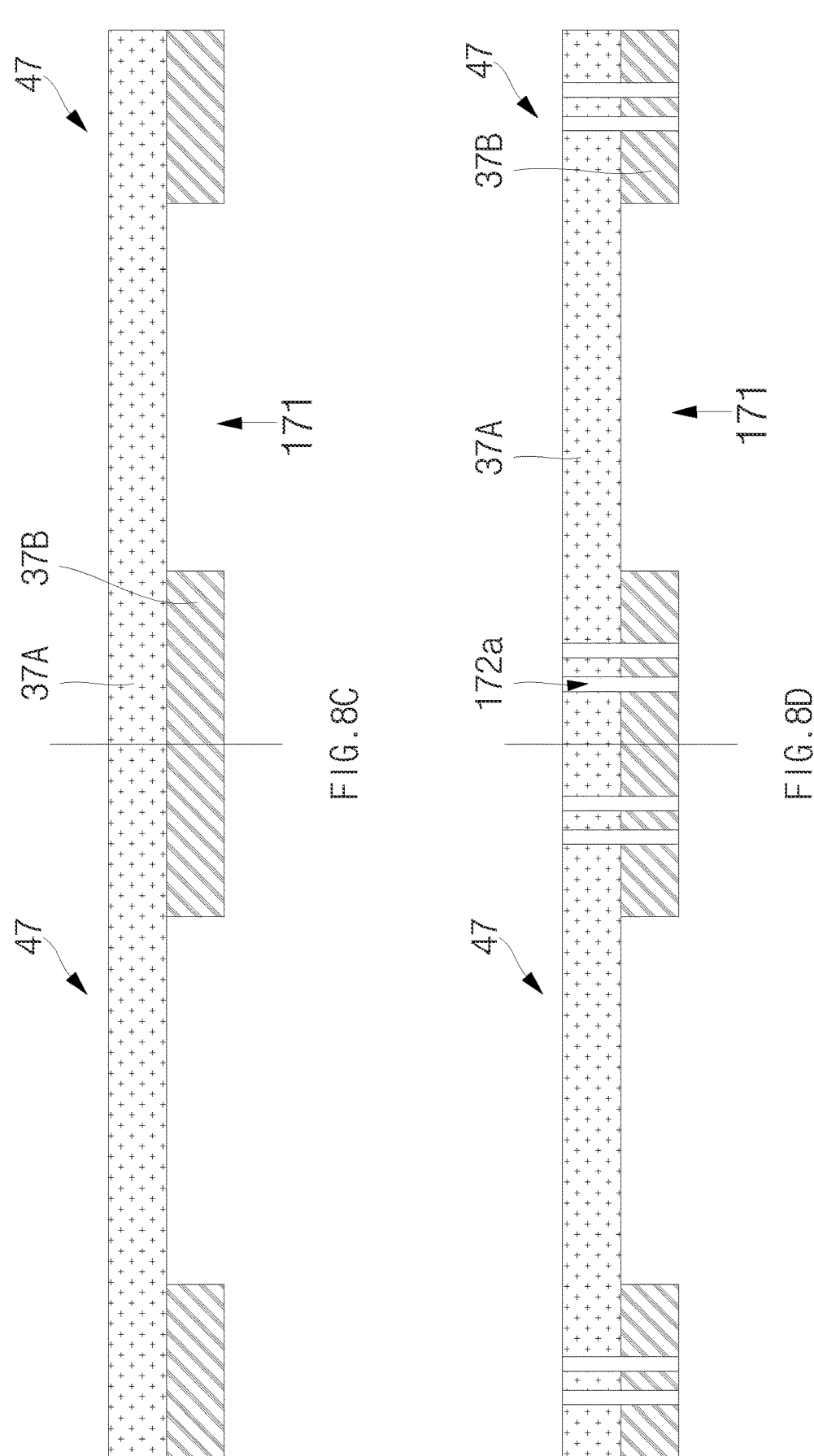

FIGS. 8A to 8H show cross-sectional views of an example method for manufacturing an example semiconductor device 40. FIG. 8A shows a cross-sectional view at an early stage of the method of manufacture. In the example shown in FIG. 8A, lid cover 37A of lid structure 47 can be provided. In some examples, lid cover 37A can comprise glass, ceramic, or polymer. In some examples, lid cover 37A can be translucent with respect to permitting passage, transmission, or receipt of light, radio-frequency (RF), or other wireless radiation or signals.

FIG. 8B shows a cross-sectional view at another stage of the method of manufacture. In the example shown in FIG. 8B, lid sidewall 37B of lid structure 47 can be provided. In some examples lid sidewall 37B can be referred to as an interposer structure, an intermediate lid structure, or a lid cavity structure. In some examples, lid sidewall 37B can comprise silicon, glass, ceramic, or polymer material. Cavity 171 can be formed through lid sidewall 37B, extending from top side to bottom side of lid sidewall 37B. In some examples, cavity 171 can be formed by chemical, mechanical, or laser etching, drilling, or ablation.

FIG. 8C shows a cross-sectional view at another stage of the method of manufacture. In the example shown in FIG.

8C, lid cover 37A and lid sidewall 37B can be coupled together to form or provide lid structure 47. In some examples, lid cover 37A and lid sidewall 37B can be attached to each other using an adhesive. Although lid sidewall 37B is shown as being pre-formed separate from lid cover 37A and then coupled together, in some examples lid sidewall 37B can be molded, grown, plated, or otherwise formed directly on lid cover 37A.

FIG. 8D shows a cross-sectional view at another stage of the method of manufacture. In the example shown in FIG. 8D, vertical hole 172*a* can be provided extending through lid cover 37A and lid sidewall 37B. In some examples, vertical hole 172*a* can be formed within lid cover 37A and lid sidewall 37B by chemical, mechanical, or laser etching, drilling, or ablation.

Figures 8E, 8F:
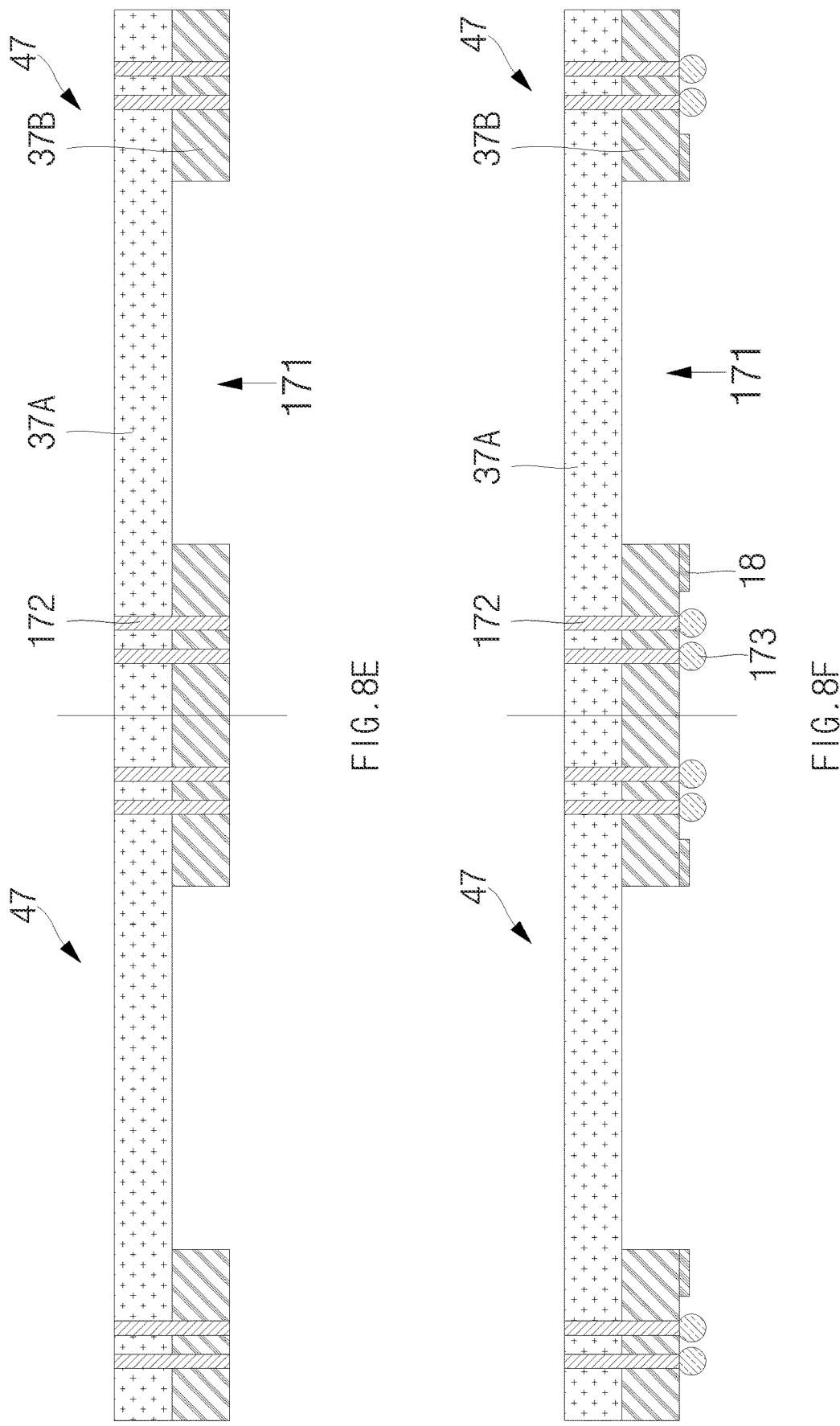

FIG. 8E shows a cross-sectional view at another stage of the method of manufacture. In the example shown in FIG. 8E, lid vertical interconnect 172 can be provided by filling vertical hole 372*a* with metal. In some examples, lid vertical interconnect 172 can be referred to as a through glass via (TGV), through silicon via (TSV) or via. In some examples, lid vertical interconnect 172 can comprise copper, silver, aluminum, or gold. Lid vertical interconnect 172 can have a diameter in the range from approximately 20 μm to approximately 150 um.

FIG. 8F shows a cross-sectional view at another stage of the method of manufacture. In the example shown in FIG. 8F, seal 18 can be attached around cavity 171 on bottom side of lid sidewall 37B. In some examples, seal 18 can be referred to as an underfill, a gasket, an adhesive, or a bond ring. In some examples, seal 18 can comprise glass frit, polymer adhesive, metal, or solder. In some examples, lid connector 173 can be provided on bottom side of lid sidewall 37B. Lid connector 173 can comprise or be referred to as a bump, ball, pillar such as post or wire, solder body, copper body, or solder cap. In some examples, lid connector 173 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, lid connector 173 can be provided by using a ball drop process, a screen-printing process, or an electroplating process. In some examples, lid connector 173 can have a height of 20 μm to 50 μm.

Figures 8G, 8H:
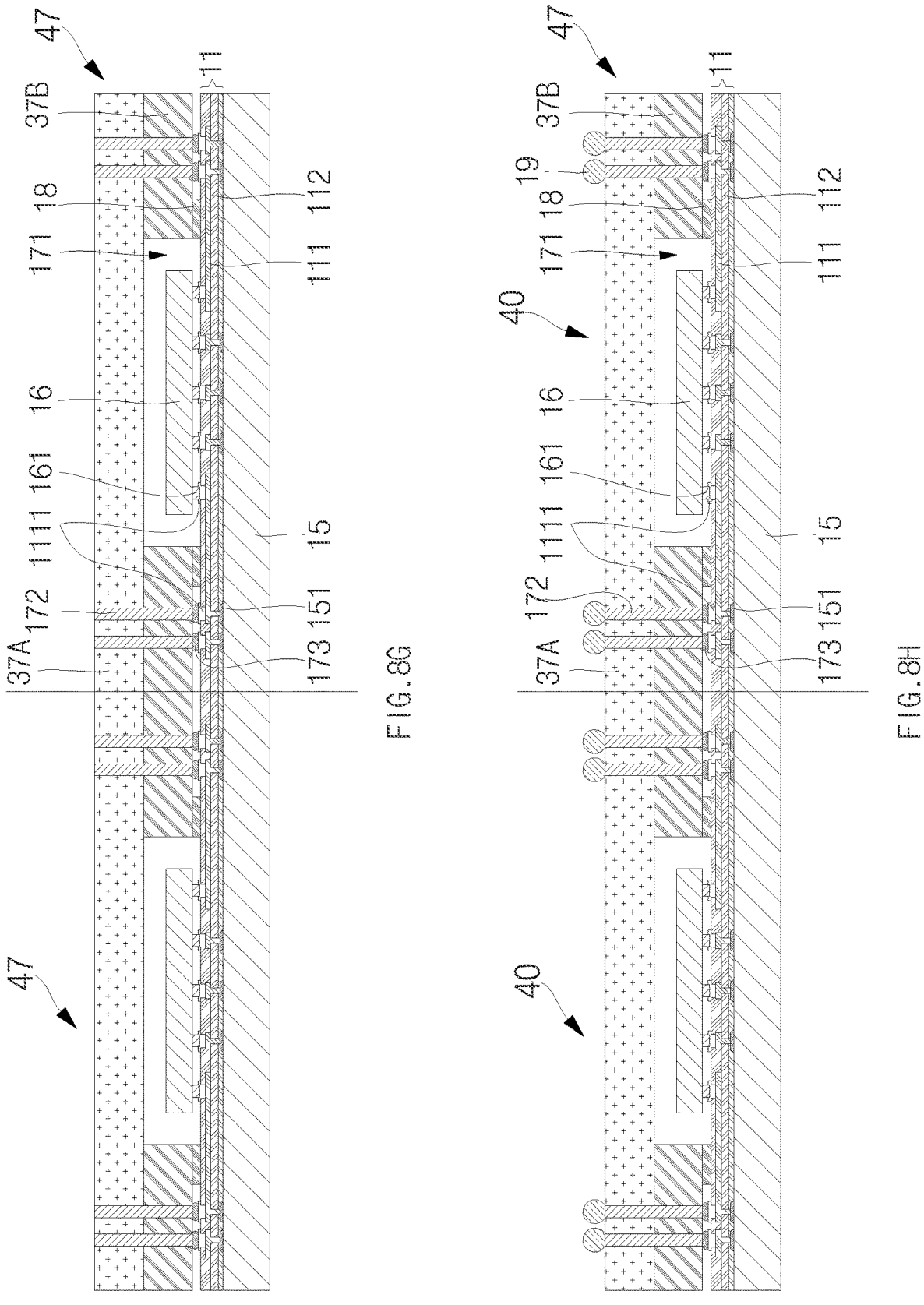

FIG. 8G shows a cross-sectional view at another stage of the method of manufacture. In the example shown in FIG. 8G, lid structure 47 can be attached to substrate 11 by seal 18. Lid vertical interconnect 172 can be electrically coupled to substrate terminal 1111 of substrate 11 with lid connector 173. In some examples, cavity 171 of lid structure 47 can surround electronic component 16.

FIG. 8H shows a cross-sectional view at another stage of the method of manufacture. In the example shown in FIG. 8H, external connector 19 can be coupled on lid structure 47. In some examples, external connector 19 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, external connector 19 can be provided by ball dropping, screen printing, or electroplating. In some examples, adjacent semiconductor devices 40 can be singulated, for example by sawing after attachment of lid structure 47.

Figure 9:
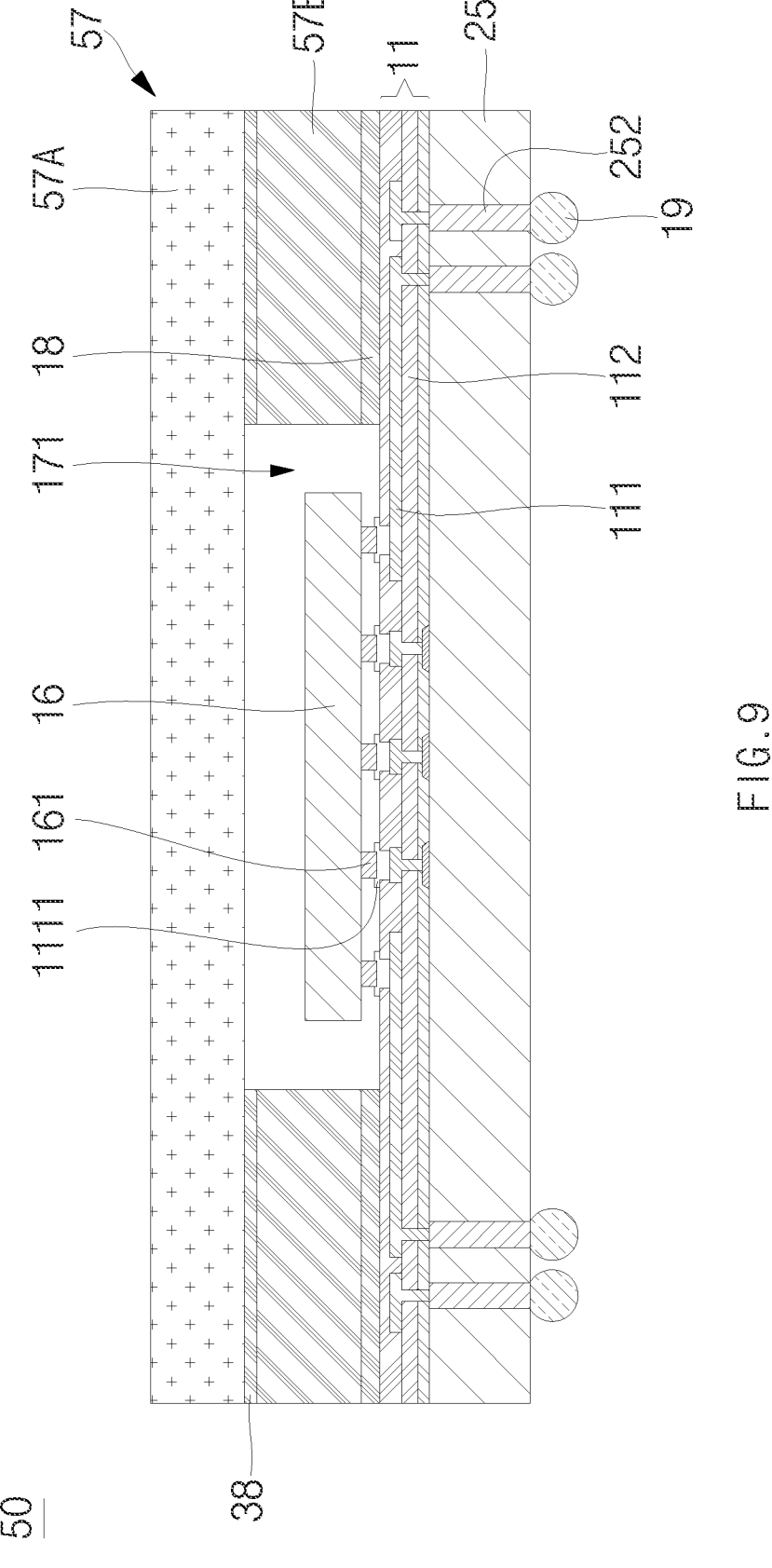
FIG. 9 shows a cross-sectional view of an example semiconductor device.

FIG. 9 shows a cross-sectional view of an example semiconductor device 50. In the example shown in FIG. 7, semiconductor device 50 can comprise substrate 11, base component 25, vertical interconnect 252, electronic component 16, lid structure 57, seal 18 and seal 38, and external connector 19. Substrate 11 can comprise conductive structure 111, dielectric structure 112, and substrate terminal 1111.

Semiconductor device 50 and its several elements can be similar to other semiconductor devices or corresponding elements described here. For example, semiconductor device 50 and its several elements can be similar to semiconductor device 20 and its corresponding elements. Semiconductor device 50 can comprise lid structure 57 that can be similar to lid structure 27, lid structure 37, or lid structure 47, and having lid cover 57A coupled to lid sidewall 57B without vertical interconnects 172. In some examples seal 38 can be omitted, for example where lid sidewall 57B is formed directly on lid cover 57A.

Substrate 11, lid structure 57, and external connector 19 can be referred to as a semiconductor package or package and can protect electronic component 16. In addition, the semiconductor package can provide electrical connection between each of external components and base component 25 or electronic component 16.

Figures 10A, 10B:
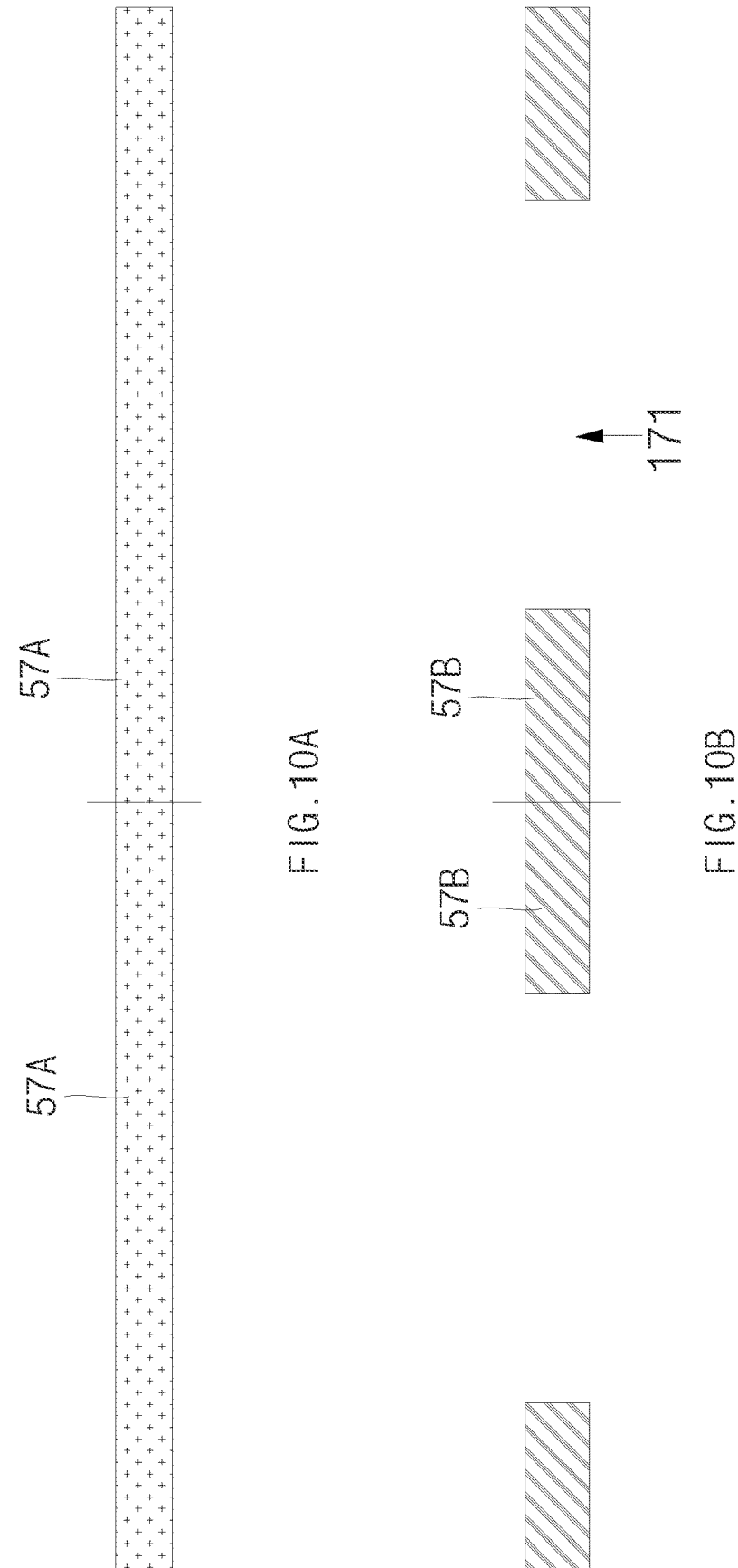
FIGS. 10A to 10F show cross-sectional views of an example method for manufacturing an example semiconductor device.

FIGS. 10A to 10F show cross-sectional views of an example method for manufacturing an example semiconductor device 50. FIG. 10A shows a cross-sectional view at an early stage of the method of manufacture. In the example shown in FIG. 10A, lid cover 57A of lid structure 57 can be provided. In some examples, lid cover 57A can comprise glass, ceramic, or polymer. In some examples, lid cover 57A can be translucent with respect to permitting passage, transmission, or reception of light, radio-frequency (RF), or other wireless radiation or signals. In some examples, lid cover 57A can be similar to lid cover 37A previously described with respect to FIG. 6A but can omit vertical hole 372*a*.

FIG. 10B shows a cross-sectional view at another stage of the method of manufacture. In the example shown in FIG. 10B, lid sidewall 57B of lid structure 57 can be provided. In some examples lid sidewall 57B can be referred to as an interposer structure, an intermediate lid structure, or a lid cavity structure. In some examples, lid sidewall 57B can comprise silicon, glass, ceramic, or polymer material. Cavity 171 can be formed through lid sidewall 57B and can extend from the top side to the bottom side of lid sidewall 57B. In some examples, cavity 171 can be formed by chemical, mechanical, or laser etching, drilling, or ablation.

Figures 10C, 10D:
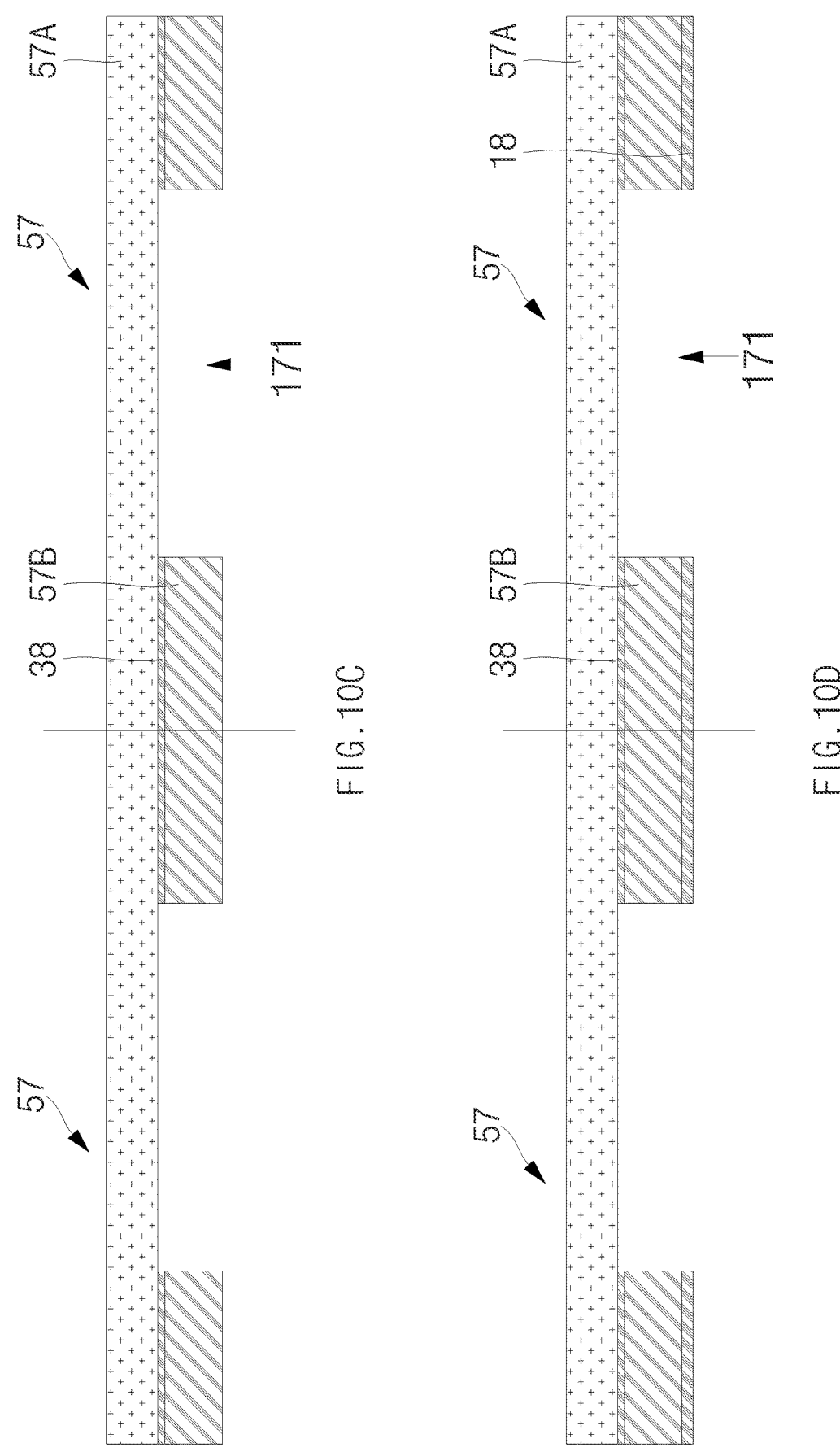

FIG. 10C shows a cross-sectional view at another stage of the method of manufacture. In the example shown in FIG. 10C, lid cover 57A can be coupled with lid sidewall 57B to define lid structure 57. Lid cover 57A and lid sidewall 57B can be coupled together by seal 38 around cavity 171. Although lid sidewall 57B is shown as being pre-formed separate from lid cover 57A and then coupled together, in some examples lid sidewall 57B can be molded, grown, plated, or otherwise formed directly on lid cover 57A.

FIG. 10D shows a cross-sectional view at another stage of the method of manufacture. In the example shown in FIG. 10D, seal 18 can be attached around cavity 171 on bottom side of lid sidewall 57B. In some examples, seal 18 can be provided on entire bottom side of lid sidewall 57B.

Figures 10E, 10F:
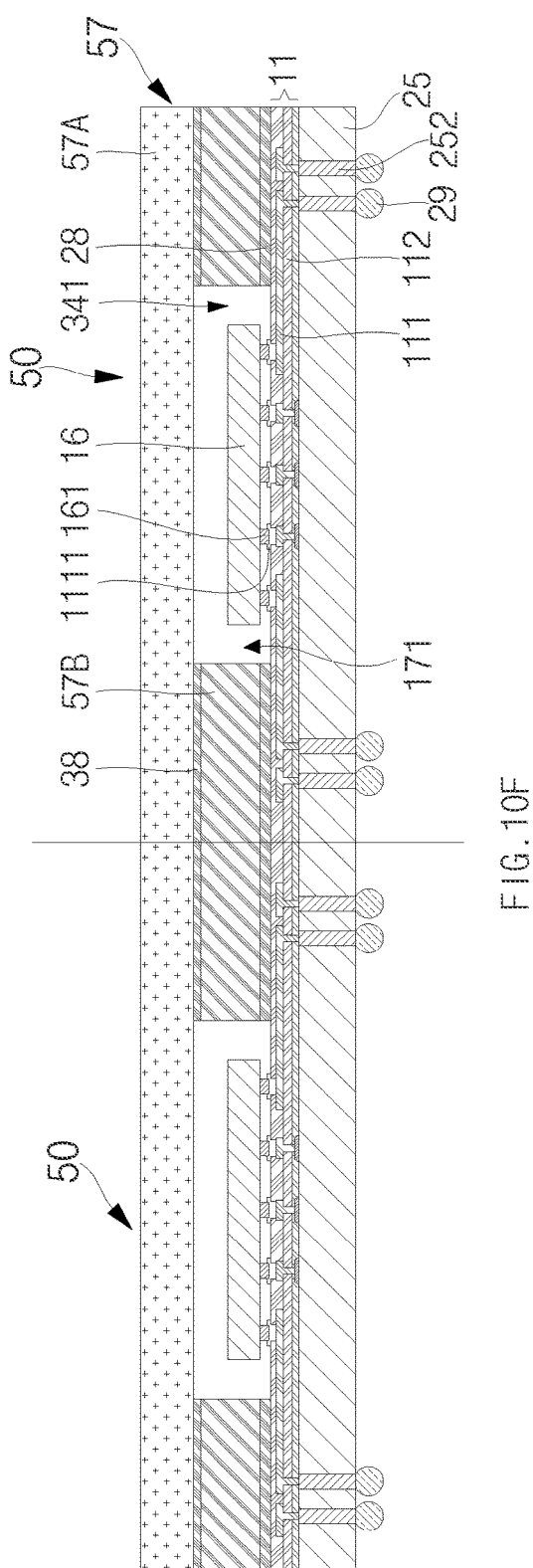

FIG. 10E shows a cross-sectional view at another stage of the method of manufacture. In the example shown in FIG. 10E, substrate 11, base component 25, or electronic component 16 can be provided as described for example with respect to FIGS. 4A-4B, and lid structure 57 can be attached on substrate 11. Lid structure 57 can be attached on substrate 11 with seal 18 or seal 28. In some examples, cavity 171 of lid structure 57 can accommodate electrical component 16, and there can be a space between lid structure 57 and the top side or lateral sides of electrical component 16.

FIG. 10F shows a cross-sectional view at another stage of the method of manufacture. In the example shown in FIG. 10F, external connector 29 can be coupled with component vertical interconnect 252 of base component 25. In some examples, such coupling can be similar to as described with respect to FIG. 4F. In some examples, adjacent semiconductor devices 50 can be singulated for example, by sawing.

The present disclosure includes reference to certain examples. It will be understood by those skilled in the art, however, that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A semiconductor device, comprising:
a base component;
a substrate over a top side of the base component and comprising a conductive structure;
an electronic component over a top side of the substrate and electrically coupled with the conductive structure;
a lid structure over the substrate and the electronic component; and
a vertical interconnect in the base component electrically coupled with the conductive structure;
wherein the lid structure comprises a material that is transmissive to electromagnetic energy;
wherein the lid structure comprises a first material, and the substrate comprises a second material different than the first material;
wherein the lid structure comprises a lid cover and a lid sidewall between the lid cover and the substrate, wherein the lid sidewall is discrete from the lid cover, and a lateral side of the lid sidewall is substantially perpendicular to the lid cover; and
wherein the vertical interconnect is discrete from the conductive structure and extends completely through the base component, and a bottom side of the vertical interconnect is flush with a bottom side of the base component.

2. The semiconductor device of claim 1, wherein the base component comprises a semiconductor material.

3. The semiconductor device of claim 1, further comprising a seal between the lid structure and the substrate, wherein the seal comprises at least one of a glass frit, metal, or solder.

4. The semiconductor device of claim 1, wherein the lid structure comprises a cavity, and the electronic component is in the cavity.

5. The semiconductor device of claim 1, further comprising a seal between the lid cover and the lid sidewall, wherein the seal is between a top side of the lid sidewall and a bottom side of the lid cover.

6. The semiconductor device of claim 1, further comprising an external interconnect electrically coupled with the vertical interconnect.

7. A semiconductor device, comprising:
a base component comprising a semiconductor material;
a substrate over a top side of the base component and comprising a conductive structure;
an electronic component over a top side of the substrate and electrically coupled with the conductive structure;
a lid structure over the substrate and the electronic component; and a vertical interconnect in the base component electrically coupled with the conductive structure;
wherein the lid structure comprises glass;
wherein the lid structure comprises a first material, and the substrate comprises a second material different than the first material;
wherein the lid structure comprises a lid cover and a lid sidewall between the lid cover and the substrate, wherein the lid sidewall is discrete from the lid cover, and a lateral side of the lid sidewall is substantially perpendicular to the lid cover; and
wherein the vertical interconnect is discrete from the conductive structure and extends completely through the base component, and a bottom side of the vertical interconnect is flush with a bottom side of the base component.

8. The semiconductor device of claim 7, wherein the lid structure comprises a cavity, and the electronic component is in the cavity.

9. The semiconductor device of claim 7, wherein the electronic component comprises an optical device.

10. The semiconductor device of claim 7, wherein the electronic component comprises a Light-Detection-And-Ranging (LiDAR) device.

11. The semiconductor device of claim 7, further comprising a seal between the lid structure and the substrate, wherein the seal comprises at least one of a glass frit, metal, or solder.

12. The semiconductor device of claim 7, further comprising a seal between the lid cover and the lid sidewall, wherein the seal is between a top side of the lid sidewall and a bottom side of the lid cover.

13. A method to manufacture a semiconductor device, comprising:
providing a substrate on a base component comprising a vertical interconnect, wherein the substrate comprises a conductive structure and the base component comprises a vertical interconnect electrically coupled with the vertical interconnect with the conductive structure;
providing an electronic device over a top side of the substrate and electrically coupling the electronic device with the conductive structure;
providing a seal on the top side of the substrate; and
providing a lid structure over the top side of the substrate and over the electronic device;
wherein the lid structure comprises a material that is transmissive to electromagnetic energy;
wherein the lid structure comprises a first material, and the substrate comprises a second material different than the first material;
wherein the lid structure comprises a lid cover and a lid sidewall between the lid cover and the substrate, wherein the lid sidewall is discrete from the lid cover, and a lateral side of the lid sidewall is substantially perpendicular to the lid cover; and
wherein the vertical interconnect is discrete from the conductive structure and extends completely through the base component, and a bottom side of the vertical interconnect is flush with a bottom side of the base component.

14. The method of claim 13, wherein the base component comprises a semiconductor material.

15. The method of claim 13, wherein the seal is attached to the lid structure, and the seal is provided on the top side of the substrate, when the lid structure is provided over the top side of the substrate.

* * * * *